US012696551B2

(12) United States Patent
Guo et al.

(10) Patent No.: US 12,696,551 B2
(45) Date of Patent: Jul. 28, 2026

(54) PHOTOVOLTAIC MODULE AND METHOD FOR MANUFACTURING PHOTOVOLTAIC MODULE

(71) Applicant: JINKO SOLAR (HAINING) CO., LTD., Haining City (CN)

(72) Inventors: Zhiqiu Guo, Haining City (CN); Shiliang Huang, Haining City (CN); Yingli Guan, Haining City (CN)

(73) Assignee: JINKO SOLAR (HAINING) CO., LTD., Haining (CN)

( * ) Notice: Subject to any disclaimer, the term of this patent is extended or adjusted under 35 U.S.C. 154(b) by 0 days.

(21) Appl. No.: 19/252,920

(22) Filed: Jun. 27, 2025

(65) Prior Publication Data

US 2025/0331318 A1      Oct. 23, 2025

Related U.S. Application Data

(63) Continuation of application No. 17/898,259, filed on Aug. 29, 2022, now Pat. No. 12,402,420.

(30) Foreign Application Priority Data

Mar. 28, 2022    (CN) .......................... 202210309343.0
Jun. 9, 2022    (CN) .......................... 202210651651.1

(51) Int. Cl.
*H10F 19/90*         (2025.01)
*H10F 71/00*         (2025.01)

(52) U.S. Cl.
CPC ......... *H10F 19/908* (2025.01); *H10F 71/137* (2025.01)

(58) Field of Classification Search
CPC ..... H10F 19/902; H10F 19/908; H10F 71/137
See application file for complete search history.

(56) References Cited

U.S. PATENT DOCUMENTS

2016/0308082 A1 * 10/2016 Ishii ...................... H10F 19/902
2020/0105954 A1 * 4/2020 Maki ................ B32B 17/10788

* cited by examiner

*Primary Examiner* — Mayla Gonzalez Ramos
(74) *Attorney, Agent, or Firm* — USCH Law, PC

(57) ABSTRACT

A photovoltaic module and a method for manufacturing the photovoltaic module are provided. The photovoltaic module includes a cell module including multiple cell string groups and multiple first connection structures. Each cell string group includes multiple cell strings arranged along a first direction. Each cell string includes multiple solar cells and multiple second connection structures. Second connection structures located on a corresponding solar cell include third connection structures interleaved with fourth connection structures, and each third connection structure is spaced from an adjacent fourth connection structure by a distance L in the first direction. A second connection structure connected to an end of a respective end first connection structure is spaced apart by a distance N in the first direction from an adjacent second connection structure connected to an end of another end first connection structure, and the distance N is less than twice the distance L.

20 Claims, 12 Drawing Sheets

PHOTOVOLTAIC MODULE AND METHOD FOR MANUFACTURING PHOTOVOLTAIC MODULE

CROSS REFERENCE TO RELATED APPLICATIONS

The present application is a continuation of U.S. patent application Ser. No. 17/898,259, filed on Aug. 29, 2022, which claims the benefit of priority under the Paris Convention to Chinese Patent Application No. 202210309343.0 filed on Mar. 28, 2022 and Chinese Patent Application No. 202210651651.1 filed on Jun. 9, 2022, each of which is incorporated herein by reference in its entirety.

TECHNICAL FIELD

Embodiments of the disclosure relate to the field of photovoltaic, and more particularly to a photovoltaic module and a method for manufacturing the photovoltaic module.

BACKGROUND

The interdigitated back contact (IBC) solar cell refers to a back contact solar cell in which positive and negative metal electrodes are arranged on the back of the cell in an interdigitated manner. The PN junction and electrodes of the IBC solar cell are disposed on the back of the cell, that is, electrodes in an emitting region and a base region of the IBC solar cell are all disposed on the back of the IBC solar cell, so that the front of the solar cell is not shielded by grid lines, which can improve photoelectric conversion performance of the cell.

Generally, lead lines are used to lead out current converged by grid lines of the cell to the outside of the photovoltaic module. One end of the lead line is connected with an end of a bus bar of the battery, the lead line is perpendicular to a surface of the photovoltaic module or a surface of the solar cell, and then the other end of the lead line is connected with a junction box, such that lead line is connected with an external element through the junction box. With the development of solar cells, the lead lines are susceptible to short circuit.

SUMMARY

Embodiments of the disclosure provide a photovoltaic module and a method for manufacturing the photovoltaic module.

Some embodiments of the disclosure provide a photovoltaic module. The photovoltaic module includes a cell module. The cell module includes multiple cell string groups and multiple first connection structures. Each of the multiple cell string groups includes multiple cell strings that are arranged along a first direction and are electrically connected in a first electrical connection mode. The multiple cell string groups include at least one first cell string group and at least one second cell string group, and a respective cell string group of the at least one first cell string group and a corresponding cell string group of the at least one second cell string group are arranged along a second direction and electrically connected in a second electrical connection mode. The multiple first connection structures extend in the first direction. Each of the multiple first connection structures is configured to connect corresponding cell strings. The multiple first connection structures include at least one middle first connection structure. Each of the at least one middle first connection structure is configured to connect at least one cell string of a corresponding first cell string group and at least one cell string of a corresponding second cell string group. Each of the multiple cell strings includes multiple second connection structures and multiple solar cells, where the multiple solar cells are electrically connected in the first electrical connection mode, and each of the multiple second connection structures is configured to connect corresponding solar cells. Second connection structures located on a corresponding solar cell include third connection structures interleaved with fourth connection structures, and each third connection structure is spaced from an adjacent fourth connection structure by a distance L in the first direction. Each of at least one second connection structure in a solar cell at an end of a respective cell string is connected with a corresponding first connection structure. A second connection structure connected to an end of a respective middle first connection structure is spaced apart by a second distance S in the first direction from an adjacent second connection structure connected to an end of another middle first connection structure adjacent to the respective middle first connection structure, and the second distance S is greater than the first distance L. The multiple first connection structures further include at least one end first connection structure, and another end of the respective cell string away from a corresponding middle first connection structure is connected with a corresponding end first connection structure. In the first direction, a second connection structure connected to an end of a respective end first connection structure is spaced apart by a third distance in the first direction from an adjacent second connection structure connected to an end of another end first connection structure adjacent to the respective end first connection structure, and the third distance is less than twice the first distance L in response to each of the plurality of cell strings including an even number of solar cells, or the third distance is greater than twice the first distance L in response to each of the plurality of cell strings including an odd number of solar cells.

In some embodiments, each of the multiple cell strings includes an even number of solar cells, and the even number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. Each of the at least one first cell string group includes multiple first cell strings and multiple first cell strings rotated by 180° that are alternately arranged in the first direction. Each of the multiple first cell strings includes the multiple first solar cells and multiple second solar cells rotated by 180° that are alternately arranged in the second direction.

In some embodiments, each of the multiple cell strings includes an even number of solar cells, and the even number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. Each of the at least one second cell string group includes multiple first cell strings rotated by 180° and multiple first cell strings that are alternately arranged in the first direction. Each of the multiple first cell strings includes multiple second solar cells rotated by 180° and the multiple first solar cells that are alternately arranged in the second direction.

In some embodiments, each of the multiple cell strings includes an odd number of solar cells, and the odd number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. A respective cell string group of the multiple cell string groups includes multiple first cell strings and multiple second cell strings rotated by 180° that are alternately arranged in the first direction, where each of the multiple first cell strings includes the multiple first solar cells and multiple second solar cells rotated by 180° that are alternately arranged in the second direction, and each of multiple second cell strings includes the multiple second solar cells rotated by 180° and the multiple first solar cells that are alternately arranged in the second direction.

In some embodiments, each solar cell of the plurality of solar cells includes a plurality of first grid lines of the first conductivity type interleaved with a plurality of second grid lines of the second conductivity type, and a respective first grid line is electrically connected with a corresponding third connection structure, and a respective second grid line is electrically connected with a corresponding fourth connection structure. In the second direction, each of the multiple first grid lines having the first conductivity type in a respective first solar cell of the multiple first solar cells and a corresponding second grid line having the second conductivity type in a second solar cell adjacent to the respective first solar cell are connected through a corresponding second connection structure. The each of the multiple first grid lines having the first conductivity type directly faces the corresponding second grid line having the second conductivity type; and each of the multiple second grid lines having the second conductivity type in a respective first solar cell of the multiple first solar cells and a corresponding first grid line having the first conductivity type in a second solar cell adjacent to the respective first solar cell are connected through a corresponding second connection structure. The each of the multiple second grid lines having the second conductivity type directly faces the corresponding first grid line having the first conductivity type.

In some embodiments, each solar cell of the plurality of solar cells includes a plurality of first grid lines of the first conductivity type interleaved with a plurality of second grid lines of the second conductivity type, and a respective first grid line is electrically connected with a corresponding third connection structure, and a respective second grid line is electrically connected with a corresponding fourth connection structure.

In some embodiments, in the second direction, a respective first grid line of a solar cell of the plurality of solar cells of each of the at least one cell string, of the corresponding first cell string group, adjacent to the respective middle first connection structure is on an extension line of a corresponding first grid line of a solar cell of the plurality of solar cells of each of the at least one cell string, of the corresponding second cell string group, adjacent to the respective middle first connection structure; and a respective second grid line of the solar cell of the plurality of solar cells of each of the at least one cell string, of the corresponding first cell string group, adjacent to the respective middle first connection structure is on an extension line of a corresponding second grid line of the solar cell of the plurality of solar cells of each of the at least one cell string, of the corresponding second cell string group, adjacent to the respective middle first connection structure.

In some embodiments, in the second direction, a respective first grid line of a solar cell of the plurality of solar cells of each of the at least one cell string of the corresponding first cell string group adjacent to the respective middle first connection structure is spaced apart by a distance W in the first direction from an extension line of a corresponding first grid line of a solar cell of the plurality of solar cells of each of the at least one cell string of the corresponding second cell string group adjacent to the respective middle first connection structure, and the distance W is less than 0.5 times the first distance L.

In some embodiments, in the second direction, a respective second grid line of a solar cell of the plurality of solar cells of each of the at least one cell string of the corresponding first cell string group adjacent to the respective middle first connection structure is spaced apart by a distance U in the first direction from an extension line of a corresponding second grid line of a solar cell of the plurality of solar cells of each of the at least one cell string of the corresponding second cell string group adjacent to the respective middle first connection structure, and the distance U is less than 0.5 times the first distance L.

In some embodiments, a respective solar cell of the multiple solar cells is a slice cell and includes an even number of grid lines.

In some embodiments, the second distance S is greater than twice the first distance L.

In some embodiments, the first distance L ranges from 3.5 mm to 20 mm; and/or the second distance S is in the range of 8 mm to 50 mm.

In some embodiments, for the multiple cell strings of each of the multiple cell string groups, a grid line on an edge of each of the multiple solar cells of a respective cell string of the multiple cell strings and a grid line on an edge of a corresponding solar cell on another cell string adjacent to the respective cell string are adjacent to each other and have opposite conductivity types.

In some embodiments, each of the multiple first grid lines and the multiple second grid lines has a width ranging from 40 um to 80 um, and each of the multiple solar cells has a thickness in a range of 100 um to 300 um.

Some embodiments of the disclosure further provide a method for manufacturing a photovoltaic module. The method includes the following. A cell module is formed. The cell module is formed as follows. Multiple cell string groups are formed. Corresponding cell strings are connected using the multiple first connection structures extending in the first direction. Specifically, the corresponding cell strings are connected as follows. At least one cell string of a respective first cell string group and at least one cell string of a corresponding second cell string group are connected with a corresponding middle first connection structure. The multiple cell string groups are formed as follows. For the each cell string group of the multiple cell string groups, the multiple cell strings are formed, including forming the each of the plurality of cell strings by electrically connecting the plurality of solar cells in the first electrical connection mode. The each of the at least one second connection structure in the solar cell at the end of the respective cell string is connected with the corresponding middle first connection structure such that the second distance S is greater than the first distance L In some embodiments, each of the multiple cell strings includes an even number of solar cells, and the even number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. A respective first cell string group of the at least one first cell string group is formed as follows. Multiple first cell strings are formed. Each of the multiple first cell strings includes the multiple first solar cells and multiple second solar cells rotated by 180° that are alternately arranged in the second direction. The respective first cell string group is formed by alternately arranging, in the first direction, several first cell strings of the multiple third cell strings and several first cell strings rotated by 180° of the multiple first cell strings.

In some embodiments, each of the multiple cell strings includes an even number of solar cells, and the even number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. A respective second cell string group of the at least one second cell string group is formed as follows. Multiple first cell strings are formed. Each of the multiple first cell strings includes multiple second solar cells rotated by 180° and the multiple first solar cells that are alternately arranged in the second direction. The respective second cell string group is formed by alternately arranging, in the first direction, several first cell strings of the multiple first cell strings and several first cell strings rotated by 180° of the multiple first cell strings.

In some embodiments, each of the multiple cell strings includes an odd number of solar cells, and the odd number of solar cells include multiple first solar cells and multiple second solar cells. A respective first solar cell of the multiple first solar cells and a respective second solar cell of the multiple second solar cells are obtained by slicing a respective initial cell of multiple initial cells, and the respective first solar cell and the respective second solar cell are symmetrical relative to a cutting line of the respective initial cell. A respective cell string group of the multiple cell string groups is formed as follows. Multiple first cell strings and multiple second cell strings are formed. Each of the multiple first cell strings includes the multiple first solar cells and multiple second solar cells rotated by 180° that are alternately arranged in the second direction, and each of multiple second cell strings includes the multiple second solar cells rotated by 180° and the multiple first solar cells that are alternately arranged in the second direction. The respective cell string group is formed by alternately arranging, in the first direction, the multiple first cell strings and the multiple second cell strings rotated by 180°.

In some embodiments, in the second direction: each of the multiple first grid lines having the first conductivity type in a respective first solar cell of the multiple first solar cells and a corresponding second grid line having the second conductivity type in a second solar cell adjacent to the respective first solar cell are connected through a corresponding second connection structure, where the each of the multiple first grid lines having the first conductivity type directly faces the corresponding second grid line having the second conductivity type; and each of the multiple second grid lines having the second conductivity type in a respective first solar cell of the multiple first solar cells and a corresponding first grid line having the first conductivity type in a second solar cell adjacent to the respective first solar cell are connected through a corresponding second connection structure, where the each of the multiple second grid lines having the second conductivity type directly faces the corresponding first grid line having the first conductivity type.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated. To describe the technical solutions of the implementations of the disclosure or the related art more clearly, the following will give a brief description of accompanying drawings used for describing the implementations of the disclosure or the related art. Apparently, the accompanying drawings described in the following are merely some implementations of the disclosure. Those of ordinary skill in the art can also obtain other accompanying drawings based on the accompanying drawings described below without creative efforts.

DETAILED DESCRIPTION OF THE EMBODIMENTS

Figure 1:
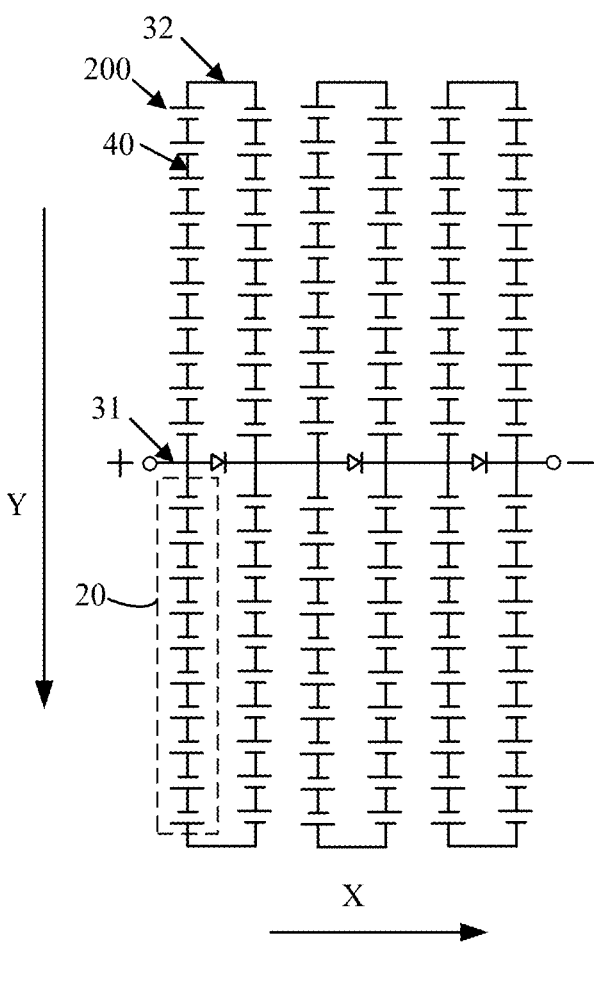
FIG. 1 is a circuit connection diagram illustrating a cell module according to an embodiment of the disclosure.

As stated above, existing photovoltaic modules are susceptible to short circuit caused by a relatively small spacing of lead lines.

One of reasons for the small spacing of the lead lines is as follows. The preparation and arrangement of cell strings including IBC solar cells are basically consistent with those of conventional solar cells (i.e., non-back contact solar cells). Since positive and negative electrodes of the IBC solar cells are generally alternatively arranged and in parallel to each other, when the conventional preparation and arrangement process of cell strings is adopted, a spacing between of lead lines of adjacent cell strings is relatively small, which may lead to short circuit caused by the relatively small spacing of the lead lines.

Embodiments of the disclosure aim to change a structure of the cell string and arrangement of cell strings in a cell string group, and ensure that a second connection structure connected to an end of a respective middle first connection structure is adjacent to another second connection structure connected to an end of another middle first connection structure adjacent to the respective middle first connection structure, and a distance S, in the first direction, between the second connection structure connected to the end of the respective middle first connection structure and the another second connection structure connected to the end of the another middle first connection structure is greater than the distance L between the first grid line and the second grid line adjacent to the first grid line of the solar cell. Therefore, the spacing between adjacent lead lines connected with the middle first connection structures is relatively large, thereby avoiding short circuit. Moreover, since the spacing between the adjacent lead lines is relatively large, that is, there is no contact between the adjacent lead lines, so that the adjacent lead lines do not need to be insulated by isolation materials, which not only simplifies the process, improves the processing efficiency, but also reduces the use of raw materials and reduces the manufacturing cost.

Various embodiments of the disclosure will be described in detail below with reference to the accompanying drawings. However, those of ordinary skill in the art should appreciate that many technical details have been proposed in various embodiments of the disclosure for better understanding of the disclosure. The technical solutions claimed in the disclosure is able to be realized even without these technical details as well as various changes and modifications based on the following embodiments.

The terms "first", "second", "third", and "fourth", "fifth", and "sixth", and so on used in the specification, the claims, and the accompany drawings of the disclosure are merely used for description and cannot be understood as explicitly or implicitly indicating relative importance or the number of technical features referred to herein, or cannot be understood as a limitation of elements or components sequentially defined.

The following will describe the technical solutions of the disclosure in detail with reference to the accompany drawings.

Figure 2:
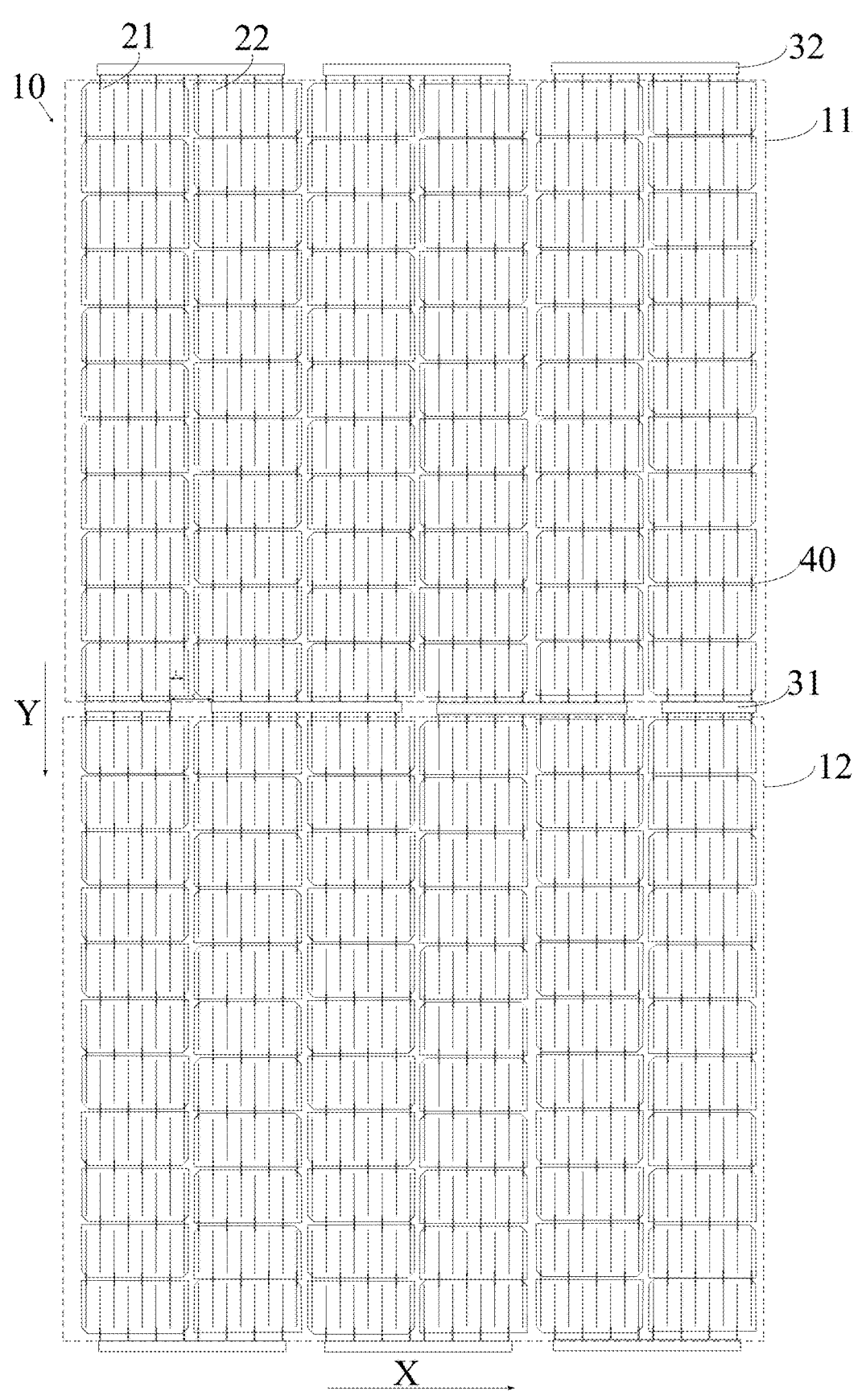
FIG. 2 is a schematic structural diagram illustrating a photovoltaic module according to an embodiment of the disclosure.
Figure 3:
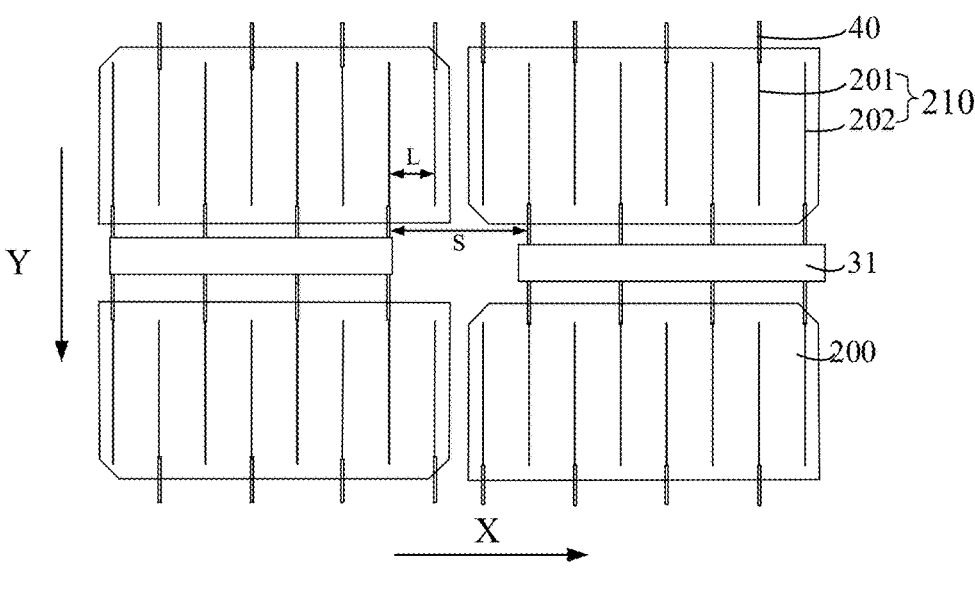
FIG. 3 is a schematic diagram illustrating a partial structure of the photovoltaic module according to an embodiment of the disclosure.
Figure 4:
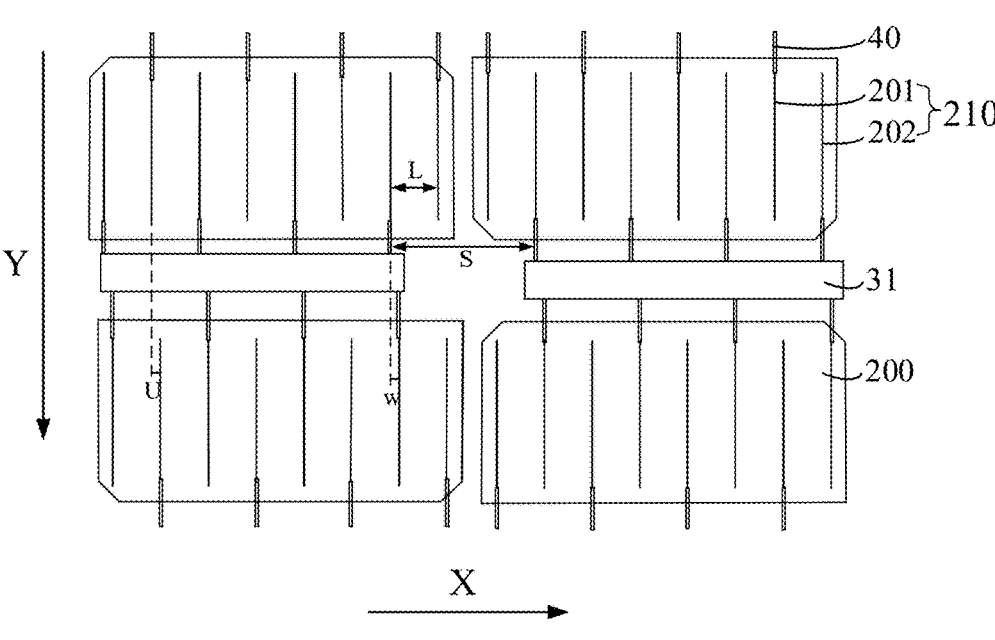
FIG. 4 is another schematic diagram illustrating a partial structure of the photovoltaic module according to an embodiment of the disclosure.
Figure 5:
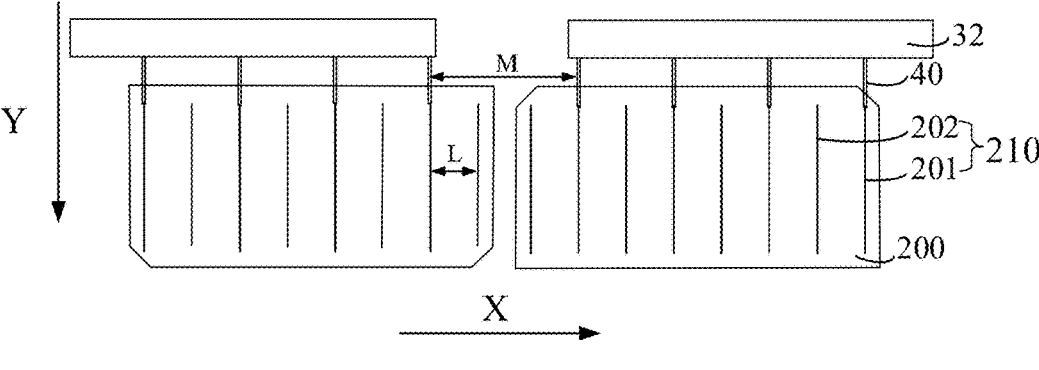
FIG. 5 is a schematic diagram illustrating another partial structure of the photovoltaic module according to an embodiment of the disclosure.
Figure 6:
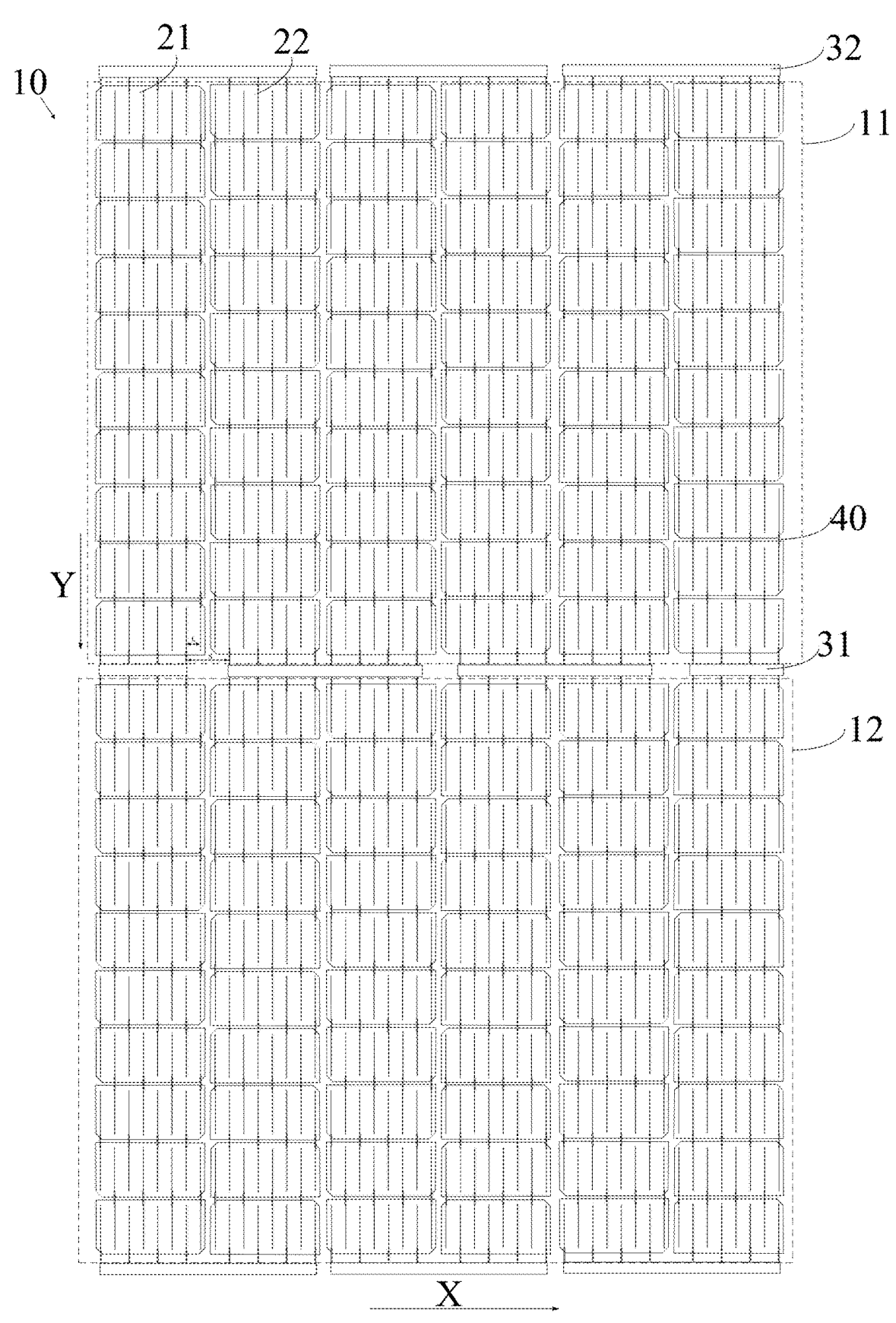
FIG. 6 is a schematic structural diagram illustrating a photovoltaic module according to another embodiment of the disclosure.
Figures 7, 8, 9:
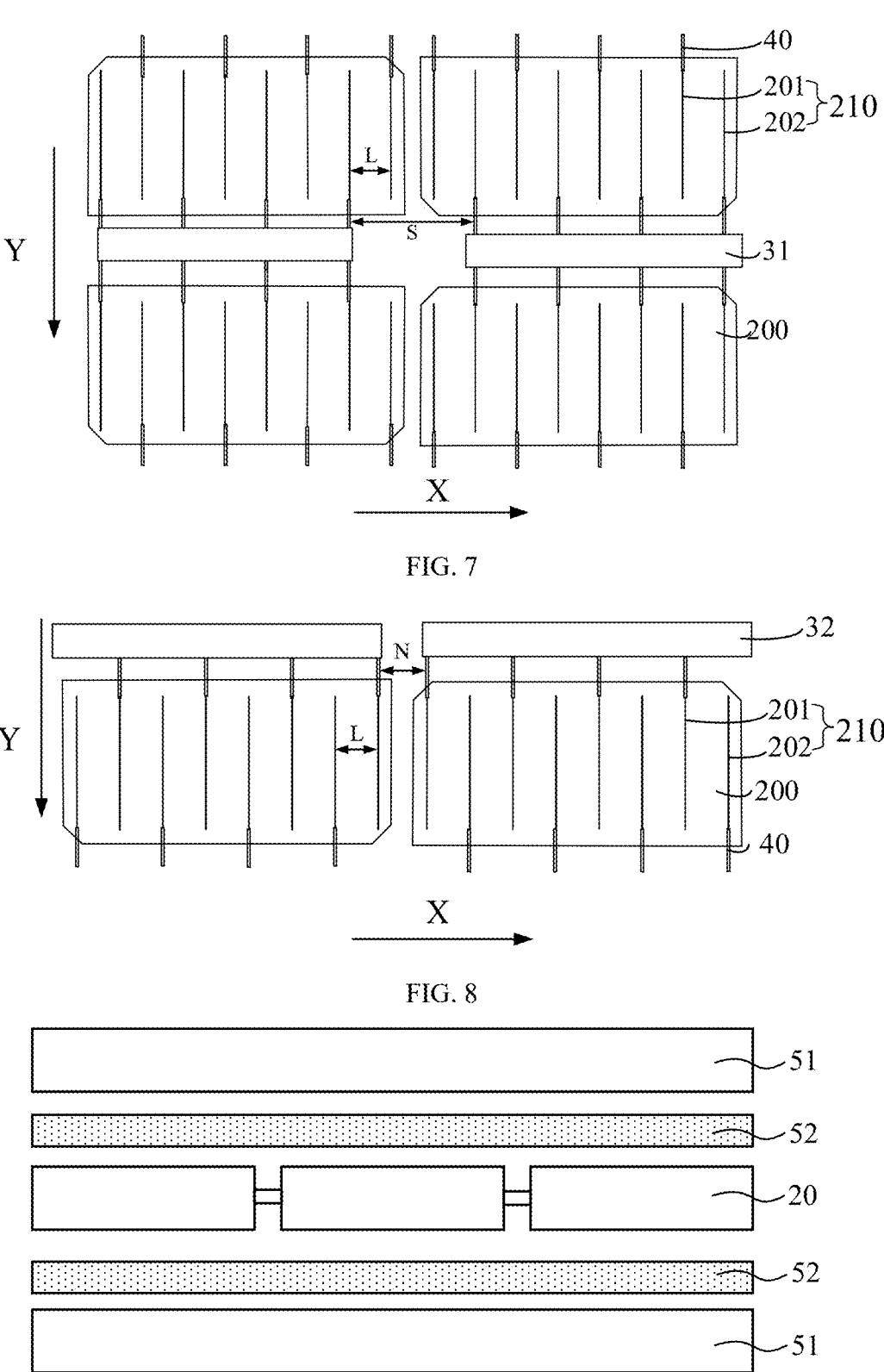
FIG. 7 is a schematic diagram illustrating a partial structure of the photovoltaic module according to an embodiment of the disclosure.
FIG. 8 is a schematic diagram illustrating another partial structure of the photovoltaic module according to an embodiment of the disclosure.
FIG. 9 is a sectional structural diagram illustrating the photovoltaic module according to an embodiment of the disclosure.

FIG. 1 is a circuit connection diagram illustrating a cell module according to an embodiment of the disclosure. FIG. 2 is a schematic structural diagram illustrating a photovoltaic module according to an embodiment of the disclosure. FIG. 3 is a schematic diagram illustrating a partial structure of the photovoltaic module according to an embodiment of the disclosure. FIG. 4 is another schematic diagram illustrating a partial structure of the photovoltaic module according to an embodiment of the disclosure. FIG. 5 is a schematic diagram illustrating another partial structure of the photovoltaic module according to an embodiment of the disclosure. FIG. 6 is a schematic structural diagram illustrating a photovoltaic module according to another embodiment of the disclosure. FIG. 7 is a schematic diagram illustrating a partial structure of the photovoltaic module according to an embodiment of the disclosure. FIG. 8 is a schematic diagram illustrating another partial structure of the photovoltaic module according to an embodiment of the disclosure. FIG. 9 is a sectional structural diagram illustrating the photovoltaic module according to an embodiment of the disclosure. It is to be noted that in the figure, a difference between a first grid line and a second grid line is reflected by a thickness of the lines, where a thin line represents the first grid line and a thick line represents the second grid line. The "middle" in the middle first connection structure refers to the middle of a distance between two cell string groups that are connected in a second electrical connection mode or the middle of the cell module along a second direction Y. The "end" in an end first connection structure refers to an end of the cell module or an end of a cell string group close an edge of the cell module along the second direction Y.

Referring to FIGS. 1 to 8, a photovoltaic module includes a cell module 10. The cell module 10 includes multiple cell string groups and multiple first connection structures. Each cell string group includes multiple cell strings 20 alternatively arranged along a first direction X, and the multiple cell strings 20 in the cell string group are connected in a first electrical connection mode. Each cell string 20 includes multiple solar cells 200 that are connected in the first electrical connection mode and multiple second connection structures 40. Each solar cell 200 has multiple first grid lines 201 of a first conductivity type interleaved with multiple second grid lines 202 of a second conductivity type, and in the first direction X, there is a distance L between a first grid line 201 and a second grid line 202 adjacent to the first grid line of the solar cell 200. The multiple cell string groups include one or more first cell string groups 11 and one or more second cell string groups 12. The one or more first cell string groups 11 and the one or more second cell string groups 12 are connected in a second electrical connection mode in a second direction Y. The multiple first connection structures extend in the first direction X, and the first connection structure is configured to connect cell strings 20. The second connection structure 40 is configured to connect grid lines 210 (including first grid lines 201 and second grid line 202), and each of at least one second connection structure 40 located at any end of a respective cell string is connected with a corresponding first connection structure. The multiple first connection structures include at least one middle first connection structure 31. Each of the at least one middle first connection structure 31 is configured to connect at least one cell string 20 of a corresponding first cell string group 11 and at least one cell string 20 of a corresponding second cell string group 12. A second connection structure 40 connected to an end of a respective middle first connection structure 31 is adjacent to another second connection structure 40 connected to an end of another adjacent middle first connection structure 31 adjacent to the respective middle first connection structure 31 and a distance S, in the first direction X, between the second connection structure 40 connected to the end of the respective middle first connection structure 31 and the another second connection structure 40 connected to the end of the another middle first connection structure is greater than a distance L between the first grid line 201 and the second grid line 202 adjacent to the first grid line 201 of the solar cell. By changing the structure of the cell string 20 and the arrangement of the cell strings 20 in the cell string group, it is ensured that the second connection structure 40 connected to the end of the middle first connection structure 31 is adjacent to the another second connection structure 40 connected to the end of the another middle first connection structure 31 and the distance S, in the first direction X, between the second connection structure 40 connected to the end of the middle first connection structure 31 and the another second connection structure 40 connected to the end of the another middle first connection structure 31 is greater than the distance L between the first grid line 201 and the second grid line 202 adjacent to the first grid line 201 of the solar cell. Therefore, the spacing between adjacent lead lines connected with the middle first connection structures is relatively large, thereby avoiding short circuit. Moreover, since the spacing between the adjacent lead lines is relatively large, that is, there is no contact between the adjacent lead lines, so that the adjacent lead lines do not need to be insulated by isolation materials, which not only simplifies the process, improves the processing efficiency, but also reduces the use of raw materials and reduces the manufacturing cost.

The solar cell 200 is a slice cell. In some embodiments, the slice cell is a half-piece cell, which can also be understood as a half-cut cell or a two-split cell. In other embodiments, the slice cell may be a three-split cell, a four-split cell, an eight-split cell, or the like. The solar cell 200 is a back contact solar cell and the solar cell 200 includes grid lines 210. The grid lines 210 are main grid lines of the solar cell 200 or electrodes of the solar cell 200. The grid lines 210 may be divided into first grid lines 201 of the first conductivity type and second grid lines 202 of the second conductivity type in terms of conductivity types. The first grid lines 201 and the second grid lines 202 are alternatively arranged in the first direction X. There may be any number of the grid lines 210 (generally 8 to 30 grid lines 210), and only the number of the first grid lines 201 and the number of the second grid lines 202 being equal is needed to be ensured. Preferably, the number of the grid lines 210 ranges from 14 to 22, such as, 8, 10, 12, 14, 16, 18, or 20. Each grid line 210 has a width ranging from 40 um to 80 um, such as, 40 um, 50 um, 60 um, 70 um, or 80 um. Preferably, the width of the grid line 210 ranges from 50 um to 60 um, such as, 50 um, 53 um, 56 um, or 60 um. In other embodiments, the number of the first grid lines 201 and the number of the second grid lines 202 are not equal. For example, the number of the grid lines 210 may be 7, 9, 11, 13, 15, 17, or 19, and the number of the first grid lines 201 is 4 and the number of the second grid lines 202 is 3. In one example, it is assumed that the solar cell 200 has eight grid lines 210, and the eight grid lines 210 includes four first grid lines 201 and four second grid lines 202. The first conductivity type is a positive polarity and the second conductivity type is a negative polarity. The first electrical connection mode is series connection, and a second electrical connection mode is parallel connection.

In some embodiments, the solar cell 200 further includes secondary grid lines, and there may be any number of secondary grid lines. Generally, the number of the secondary grid lines ranges from 100 to 250, such as, 100, 110, 120, 130, 140, 150, 160, 170, or 180. Preferably, the number of the secondary grid lines is in a range of 140 to 180, such as, 148, 150, 156, 166, 171, 178, or 180. The secondary grid line has a width ranging from 20 um to 60 um, such as, 20 um, 30 um, 40 um, 50 um, or 60 um. Preferably, the width of the secondary grid line is in the range of 20 um to 40 um, such as, 23 um, 26 um, 34 um, or 39 um. There may be 8 to 20 welding sections on the grid lines 210, and the welding sections have a same area. In other embodiments, the welding sections may have different areas, for example, an area of the welding section on the grid line 210 of either of both ends of the cell string is larger than that of a welding section on the grid line 210 of the middle of the cell string. It will be understood that the welding section is a contact section where the grid line 210 is in contact with the second connection structure 40.

In some embodiments, the back contact solar cell includes a silicon substrate, a front surface field (FSF) layer (which has the same conductivity type as the silicon substrate) located on a first surface of the silicon substrate, and a first passivation layer located on a surface of the FSF layer, a first doped semiconductor layer and a second doped semiconductor layer that are located on a second surface of the silicon substrate, a second passivation layer, a first electrode, and second electrode. The second passivation layer is located on the surface of the first doped semiconductor layer, the second doped semiconductor layer, and the surface of the silicon substrate. The first electrode penetrates the second passivation layer and is connected with the first doped semiconductor layer. The second electrode penetrates the second passivation layer and is connected with the second doped semiconductor layer. In other embodiments, the back contact solar cell includes a silicon substrate, a first passivation layer, a first doped semiconductor layer, a tunneling oxide layer, a doped polysilicon layer, a second passivation layer, a first electrode, and a second electrode. The first passivation layer is disposed on a first surface of the silicon substrate. The first doped semiconductor layer is disposed on a second surface of the silicon substrate, where the first doped semiconductor layer may have the same conductivity type as the silicon substrate or may have a different conductivity type from the silicon substrate. The tunneling oxide layer and the doped polysilicon layer are sequentially disposed on the second surface of the silicon substrate. The second passivation layer is disposed on a surface of the first doping semiconductor layer and the doped polysilicon layer. The first electrode penetrates the second passivation layer and is then connected with the doped polysilicon layer. The second electrode penetrates the second passivation layer and is then connected with the first doped semiconductor layer. In other embodiments, the back contact solar cell includes a silicon substrate, a first passivation layer, a tunneling oxide layer, a first doped polysilicon layer, a second doped polysilicon layer, a second passivation layer, a first electrode, and a second electrode. The first passivation layer is disposed on a first surface of the silicon substrate. The tunneling oxide layer, the first doped polysilicon layer, and the second doped polysilicon layer are arranged on a second surface of the silicon substrate. The second passivation layer is disposed on a surface of the first doped polysilicon layer, the second doped polysilicon layer, and the silicon substrate. The first electrode penetrates the second passivation layer and is then connected with the first doped polysilicon layer. The second electrode penetrates the second passivation layer and is connected with the second doped polysilicon layer. It can be understood that the first surface is a front surface of the silicon substrate, the second surface is a back surface of the silicon substrate, the first doped semiconductor layer is one of a N-type doped semiconductor layer and a P-type doped semiconductor layer, and the second doped semiconductor layer is the other of the N-type doped semiconductor layer and the P-type doped semiconductor layer.

In some embodiments, a thickness of the solar cell may be in a range of 100 um to 300 um, such as, 100 um, 180 um, 220 um, or 300 um. Preferably, the thickness of the solar cell may be in the range of 120 to 180 um, such as, 120 um, 134 um, 153 um, or 179 um. In other embodiments, a size of the solar cell 200 may be in a range of 150 mm to 300 mm, such as, 156.75 mm, 158.75 mm, 166 mm, 182 mm, or 210 mm. The solar cell 200 may be in the shape of a rectangle, a circle, a square, an approximately rectangle, or the like. In other embodiments, a ratio of the thickness to the width of the solar cell may be in the range of $0.5*10^3$ to $2*10^3$, such as, $0.5*10^3$, $0.8*10^3$, $1.6*10^3$, or $1.89*10^3$. Preferably, a ratio of the thickness to the width of the solar cell may be ranging from $1*10^3$ to $1.8*10^3$, such as, $1.1*10^3$, $1.32*10^3$, $1.65*10^3$, or $1.79*10^3$. In other embodiments, the solar cell 200 may be a monocrystalline silicon solar cell, a polysilicon solar cell, an amorphous silicon solar cell, or a multicomponent compound solar cell. The multicomponent compound solar cell may be a cadmium sulfide solar cell, a gallium arsenide solar cell, a copper indium selenium solar cell, or a perovskite solar cell. In one example, the ratio of the thickness to the width of the solar cell 200 is $1*10^3$, the thickness of the solar cell is 166 um, the size of the entire solar cell 200 is 166 mm, the solar cell 200 may have a rectangular shape, and the solar cell 200 is a monocrystalline silicon solar cell.

In some embodiments, the cell string group includes multiple first cell strings 21 and multiple second cell strings 22, where the multiple first cell strings 21 and the multiple second cell strings 22 are alternately arranged. A grid line 210 on an edge of each of the multiple solar cells 200 of a respective first cell string 21 and a grid line 210 on an edge of a corresponding solar cell 200 on a second cell string 22 adjacent to the respective first cell string are adjacent to each other and have opposite conductivity types. The second connection structure 40 connected to the end of the respective middle first connection structure 31 is adjacent to the another second connection structure 40 connected to the end of the another middle first connection structure 31 adjacent to the respective middle first connection structure and the distance S, in the first direction X, between the second connection structure 40 connected to the end of the respective middle first connection structure 31 and the another second connection structure 40 connected to the end of the another middle first connection structure 31 is greater than twice the distance L between the first grid line 201 and the second grid line 202 adjacent to the first grid line 201 of the solar cell.

In some embodiments, the cell string group sequentially includes a first cell string 21 and a second cell string 22 in the first direction X. Multiple first cell strings 21 and multiple second cell strings 22 are alternatively arranged and in parallel to one another in the first direction X. Electrode directions in the first cell string 21 and the second cell string 22 are opposite to each other, or current transmission directions in the first cell string 21 and the second cell string 22 are opposite to each other. A cell string group substantially having a rectangular shape is formed in a connection manner in which a positive electrode of a first cell string 21 is connected to a negative electrode of a second cell string 22 adjacent to the first cell string 21 and a positive electrode of the second cell string 22 is connected to a negative electrode of another first cell string 21 adjacent to the second cell string 22.

In some embodiments, in the second direction Y, a first respective first grid line 201 of each of the at least one solar cell 200, of the corresponding first cell string group 11, adjacent to the respective middle first connection structure 31 directly faces a corresponding first grid line 201 of each of the at least one solar cell 200, of the corresponding second cell string group 12, adjacent to the respective middle first connection structure 31. A respective second grid line 202 of each of the at least one solar cell 200, of the corresponding first cell string group 11, adjacent to the respective middle first connection structure 31 directly faces a corresponding second grid line 202 of each of the at least one solar cell 200, of the corresponding second cell string group 12, adjacent to the respective middle first connection structure 31. Therefore, in the second direction Y, each of at least one second connection structure 40 that is located on an upper side of the respective middle first connection structure 31 and connected with a corresponding first grid line 201 directly faces a corresponding second connection structure 40 located on a lower side of the respective middle first connection structure 31. Compared with a scenario where the second connection structure 40 located on the upper side of the middle first connection structure 31 does not directly face the second connection structure 40 located on the lower side of the middle first connection structure 31, in this case, a length of the middle first connection structure 31 can be reduced, that is, the use of raw materials can be reduced, thereby reducing the manufacturing cost.

In some embodiments, in the second direction Y, a first respective first grid line 201 of each of the at least one solar cell 200, of the corresponding first cell string group 11, adjacent to the respective middle first connection structure 31 is on an extension line of a corresponding first grid line 201 of each of the at least one solar cell 200, of the corresponding second cell string group 12, adjacent to the respective middle first connection structure 31. A respective second grid line 202 of each of the at least one solar cell 200, of the corresponding first cell string group 11, adjacent to the respective middle first connection structure 31 is on an extension line of a corresponding second grid line 202 of each of the at least one solar cell 200, of the corresponding second cell string group 12, adjacent to the respective middle first connection structure 31. In other embodiments, referring to FIG. 4, in the second direction Y, a first respective first grid line 201 of each of the at least one solar cell 200, of the corresponding first cell string group 11, adjacent to the respective middle first connection structure 31 is close to an extension line of a corresponding first grid line 201 of each of the at least one solar cell 200, of the corresponding second cell string group 12, adjacent to the respective middle first connection structure 31. A distance W, in the first direction X, between the respective first grid line 201 of each of the at least one solar cell 200, of the corresponding first cell string group 11, adjacent to the respective middle first connection structure 31 and the extension line of the corresponding first grid line 201 of each of the at least one solar cell 200, of the corresponding second cell string group 12, adjacent to the respective middle first connection structure 31 is less than 0.5 times the distance L between the first grid line 201 and the second grid line 202 of the solar cell 200. In the second direction Y, a respective second grid line 202 of each of the at least one solar cell 200, of the corresponding first cell string group 11, adjacent to the respective middle first connection structure 31 is close to an extension line of a corresponding second grid line 202 of each of the at least one solar cell 200, of the corresponding second cell string group 12, adjacent to the respective middle first connection structure 31. A distance U, in the first direction, between the respective second grid line 202 of each of the at least one solar cell 200, of the corresponding first cell string group 11, adjacent to the respective middle first connection structure 31 and the extension line of the corresponding second grid line 202 of each of the at least one solar cell 200, of the corresponding second cell string group 12, adjacent to the respective middle first connection structure 31 is less than 0.5 times the distance L between the first grid line 201 and the second grid line 202 of the solar cell 200.

In some embodiments, the middle first connection structure 31 is used for preventing the number of cell strings that are connected in parallel through an end first connection structure 32 from being too large to exceed a cell reverse bias limit, thereby avoiding damaging the photovoltaic module. The first connection structures further include multiple end first connection structures 32. The end first connection structure 32 is an end bus bar. The other end of the respective cell string away from the corresponding middle first connection structure is connected with a corresponding end first connection structure. The end first connection structures 32 are respectively arranged on both ends of the cell module.

In some embodiments, referring to FIG. 2 and FIG. 5, each cell string includes an odd number of solar cells 200. In the first direction X, a second connection structure 40 connected to an end of a respective end first connection structure 32 is adjacent to another second connection structure 40 connected to an end of another end first connection structure 32 adjacent to the respective end first connection structure 32. A distance M, in the first direction X, between the second connection structure 40 connected to the end of the respective end first connection structure 32 and the another second connection structure 40 connected to the end of the another end first connection structure 32 is greater than twice the distance L between the first grid line 201 and the second grid line 202 of the solar cell 200. In other embodiments, referring to FIG. 6 and FIG. 8, each cell string includes an even number of solar cells 200. In the first direction X, a second connection structure 40 connected to an end of a respective end first connection structure 32 is adjacent to another second connection structure 40 connected to an end of another end first connection structure 32 adjacent to the respective end first connection structure 32. A distance N, in the first direction X, between the second connection structure 40 connected to the end of the respective end first connection structure 32 and the another second connection structure 40 connected to the end of the another end first connection structure 32 is greater than twice the distance L between the first grid line 201 and the second grid line 202 of the solar cell 200 is less than twice the distance L between the first grid line 201 and the second grid line 202 of the solar cell 200. In some embodiments, the photovoltaic module further includes: lead lines (not illustrated) and a junction box (not illustrated). The lead lines are connected to the middle first connection structures 31, one of adjacent lead lines is connected to a positive output of a cell string and the other of the adjacent lead lines is connected to a negative output of another cell string 20 adjacent to the cell string. The junction box is provided with a diode, and both ends of the diode are connected in reverse parallel with the cell string through the lead lines, so as to avoid exceeding the cell reverse bias limit and further avoid damaging the photovoltaic module.

In some embodiments, the distance L between the first grid line 201 and the second grid line 202 of the solar cell 200 ranges from 3.5 mm to 20 mm, for example, the distance L may be 4 mm, 8 mm, 12 mm, 16 mm, or 19 mm. Preferably, the distance L between the first grid line 201 and the second grid line 202 of the solar cell 200 ranges from 4 mm to 10 mm, such as, 4.3 mm, 5.6 mm, 6.3 mm, 8.2 mm, or 9.9 mm. The second connection structure 40 connected to the end of the respective middle first connection structure 31 is adjacent to the another second connection structure 40 connected to the end of the another middle first connection structure 31 adjacent to the respective middle first connection structure 31, and the distance S, in the first direction X, between the second connection structure 40 connected to the end of the respective middle first connection structure 31 and the another second connection structure 40 connected to the end of the another middle first connection structure 31 adjacent to the respective middle first connection structure 31 ranges from 8 mm to 50 mm, such as, 9 mm, 20 mm, 30 mm, 40 mm, or 45 mm. Preferably, the distance S, in the first direction X, between the second connection structure 40 and the another second connection structure 40 ranges from 10 mm to 25 mm, such as, 12 mm, 15 mm, 16.9 mm, 19 mm, or 23.9 mm. In one example, the distance L between the first grid line 201 and the second grid line 202 of the solar cell 200 is 4.3 mm, and the distance S, in the first direction X, between the second connection structure 40 and the another second connection structure 40 is 12 mm, such that the distance S is greater than twice the distance L between the first grid line 201 and the second grid line 202 of the solar cell 200. Therefore, the spacing between adjacent lead lines connected with the middle first connection structures is relatively large, thereby avoiding short circuit. Moreover, since the spacing between the adjacent lead lines is relatively large, that is, there is no contact between the adjacent lead lines, so that the adjacent lead lines do not need to be insulated by isolation materials, which not only simplifies the process, improves the processing efficiency, but also reduces the use of raw materials and reduces the manufacturing cost.

In some embodiments, referring to FIG. 9, the photovoltaic module further includes a cover plate 51 and an encapsulation layer 52. The encapsulation layer 52 may be an organic encapsulation film, such as, a Polyethylene vinylacetate (EVA) film or a Polyolefin elastomer (POE) film. The encapsulation layer 52 covers a surface of a cell string for sealing the cell string. The cover plate 51 may be a glass cover plate or a plastic cover plate, or the like. The cover plate 51 covers a surface of the encapsulation layer away from the cell string. The cover plate 51 is provided with a light trapping structure to increase the utilization rate of the incident light. The photovoltaic module has a relatively high current collection capacity and a relatively low carrier recombination rate, which can achieve relatively high photoelectric conversion efficiency.

The embodiment of the disclosure provide a photovoltaic module, by changing the structure of the cell string 20 and the arrangement of the cell strings 20 in the cell string group, it is ensured that the second connection structure 40 connected to the end of the middle first connection structure 31 is adjacent to the another second connection structure 40 connected to the end of the another middle first connection structure 31 and the distance S, in the first direction X, between the second connection structure 40 connected to the end of the middle first connection structure 31 and the another second connection structure 40 connected to the end of the another middle first connection structure 31 is greater than the distance L between the first grid line 201 and the second grid line 202 adjacent to the first grid line 201 of the solar cell. Therefore, the spacing between adjacent lead lines connected with the middle first connection structures is relatively large, thereby avoiding short circuit. Moreover, since the spacing between the adjacent lead lines is relatively large, that is, there is no contact between the adjacent lead lines, so that the adjacent lead lines do not need to be insulated by isolation materials, which not only simplifies the process, improves the processing efficiency, but also reduces the use of raw materials and reduces the manufacturing cost.

According to some embodiments of the disclosure, another aspect of the embodiment of the disclosure provides a method for manufacturing a photovoltaic module, to manufacture the photovoltaic module described in the above embodiments.

Figures 10, 11:
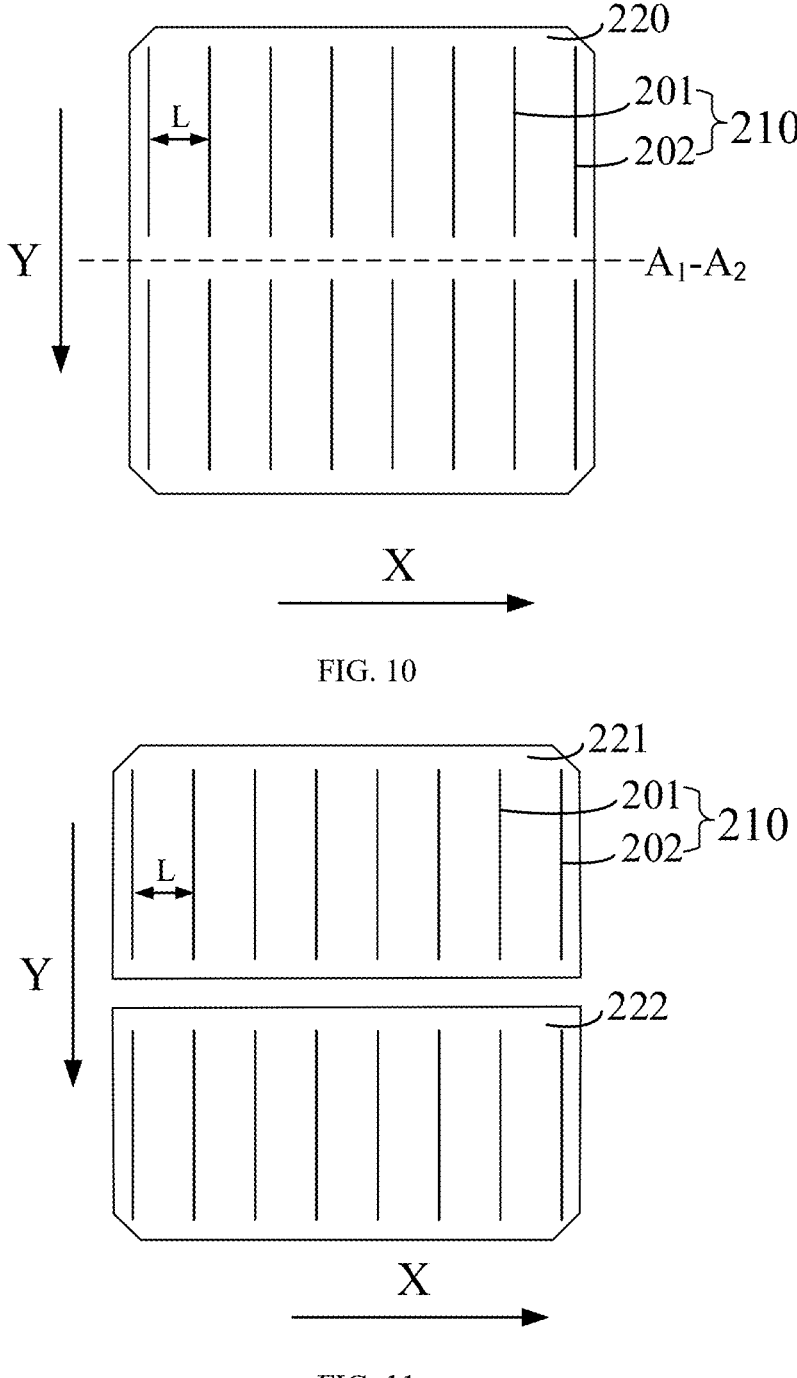
FIG. 10 is a schematic structural diagram of forming an initial cell in a method for manufacturing a photovoltaic module according to an embodiment of the disclosure.
FIG. 11 is a schematic structural diagram of forming a solar cell in a method for manufacturing a photovoltaic module according to an embodiment of the disclosure.

FIG. 10 is a schematic structural diagram of forming an initial cell in a method for manufacturing a photovoltaic module according to an embodiment of the disclosure. Referring to FIG. 10, multiple initial cells 220 are provided. The initial cell 220 is a back contact solar cell and the initial cell 220 has an even number of grid lines 210. The grid line 210 is a main grid line or an electrode of the initial cell 220. The grid lines 210 may be divided into first grid lines 201 of a first conductivity type and second grid lines 202 of a second conductivity type according to conductivity types. The first grid lines 201 and the second grid lines 202 are alternatively arranged at intervals in the first direction X, and there is a distance L, in the first direction X, between the first grid line 201 and the second grid line 202 adjacent to the first grid line 201. There may be any number of the grid lines 210 (generally 8 to 30 grid lines 210), and only the number of the first grid lines 201 and the number of the second grid lines 202 being equal is needed to be ensured. Preferably, the number of the grid lines 210 may range from 14 to 22, such as, 8, 10, 12, 14, 16, 18, or 20. Each grid line 210 has a width ranging from 40 um to 80 um. Preferably, the width of the grid line 210 ranges from 50 um to 60 um, such as, 50 um, 53 um, 56 um, or 60 um. In other embodiments, the number of the first grid lines 201 is not equal to the number of the second grid lines 202, for example, the number of the first grid lines 201 is 4 and the number of the second grid lines 202 is 3. Specifically, it is assumed that each initial cell 220 has eight grid lines 210, the first conductivity type is a positive polarity, and the second conductivity type is a negative polarity.

FIG. 11 is a schematic structural diagram of forming a solar cell in a method for manufacturing a photovoltaic module according to an embodiment of the disclosure. Referring to FIG. 11, an initial cell 220 is sliced to form two solar cells, where the two solar cells include a first solar cell 221 and a second solar cell 222. The initial cell 220 is sliced to form the first solar cell 221 and the second solar cell 222, and the first solar cell 221 and the second solar cell 222 are symmetrical relative to a cutting line $A_1$-$A_2$ (referring to FIG. 10) of the initial cell. The first solar cell 221 has four first grid lines 201 and four second grid lines 202. The first grid lines 201 and the second grid lines 202 are alternatively arranged at intervals. Similarly, the second solar cell 222 has four first grid lines 201 and four second grid lines 202, and the first grid lines 201 and the second grid lines 202 are alternatively arranged at intervals.

In other embodiments, the solar cells include a first solar cell, a second solar cell, and a third solar cell, i.e., the solar cell is a three-split cell. In still other embodiments, the solar cell is a four-split cell or an eight-split cell.

Figure 12:
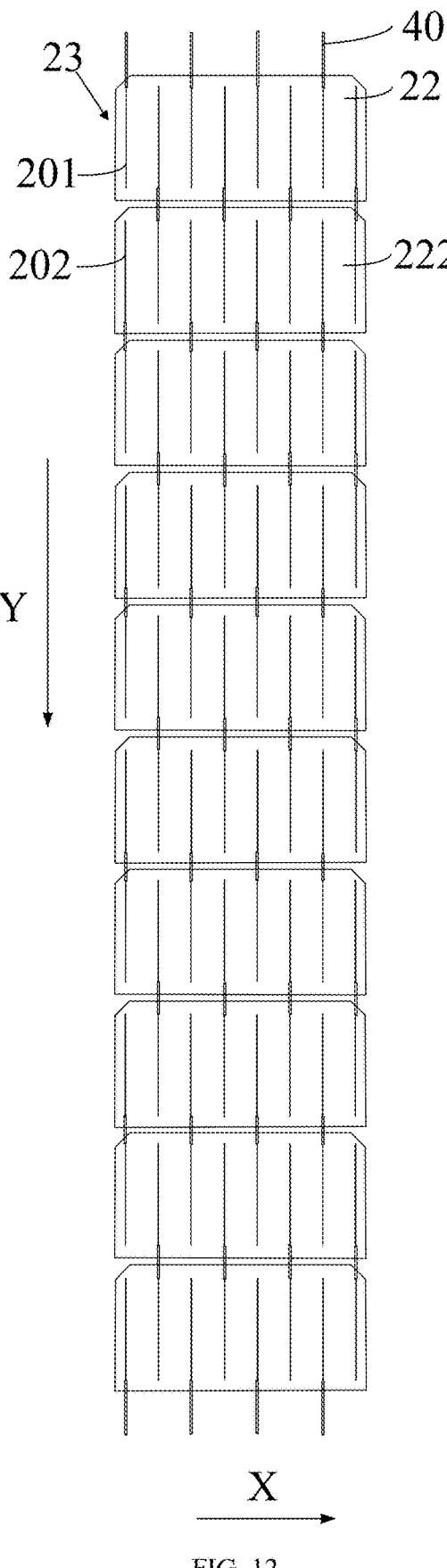
FIG. 12 is a schematic structural diagram of forming a third cell string in a method for manufacturing a photovoltaic module according to an embodiment of the disclosure.
Figure 13:
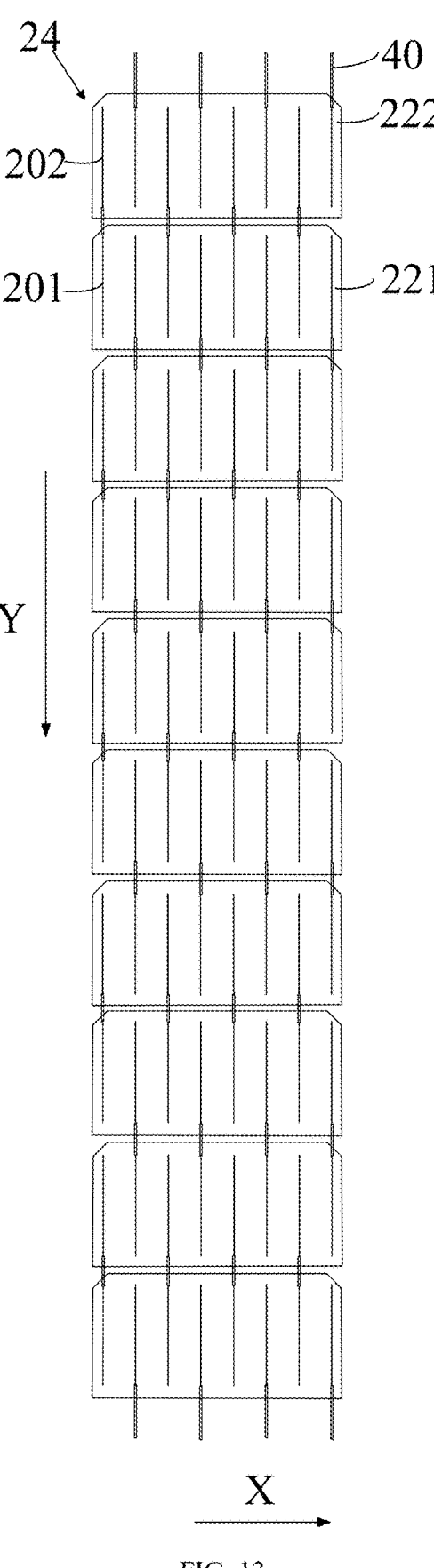
FIG. 13 is a schematic structural diagram of forming a fourth cell string in a method for manufacturing a photovoltaic module according to an embodiment of the disclosure.
Figure 15:
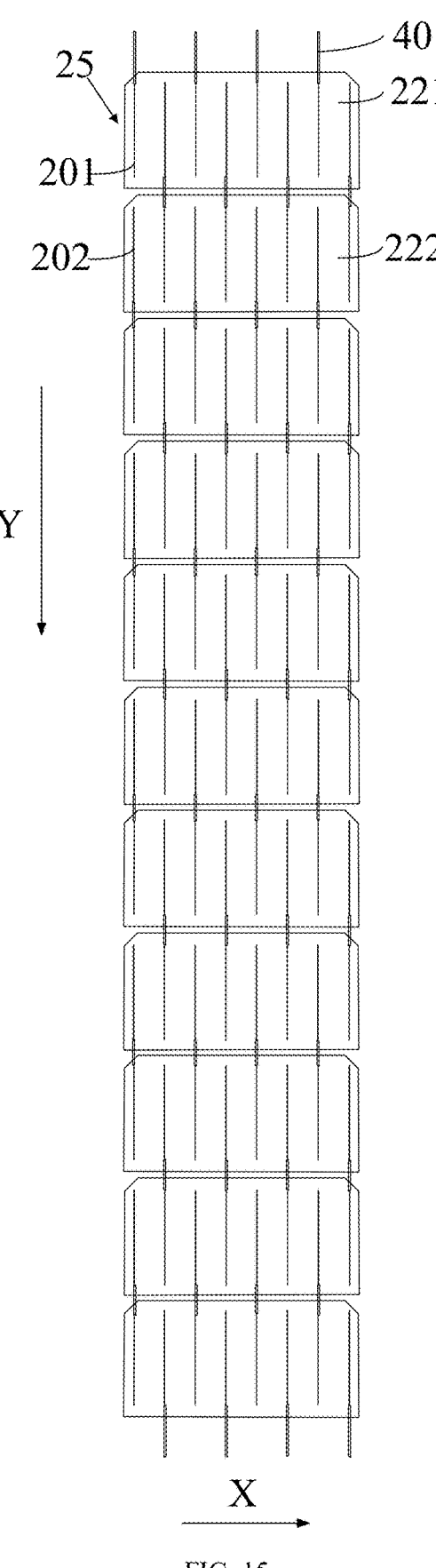
FIG. 15 is a schematic structural diagram of forming a fifth cell string in a method for manufacturing a photovoltaic module according to an embodiment of the disclosure.
Figure 16:
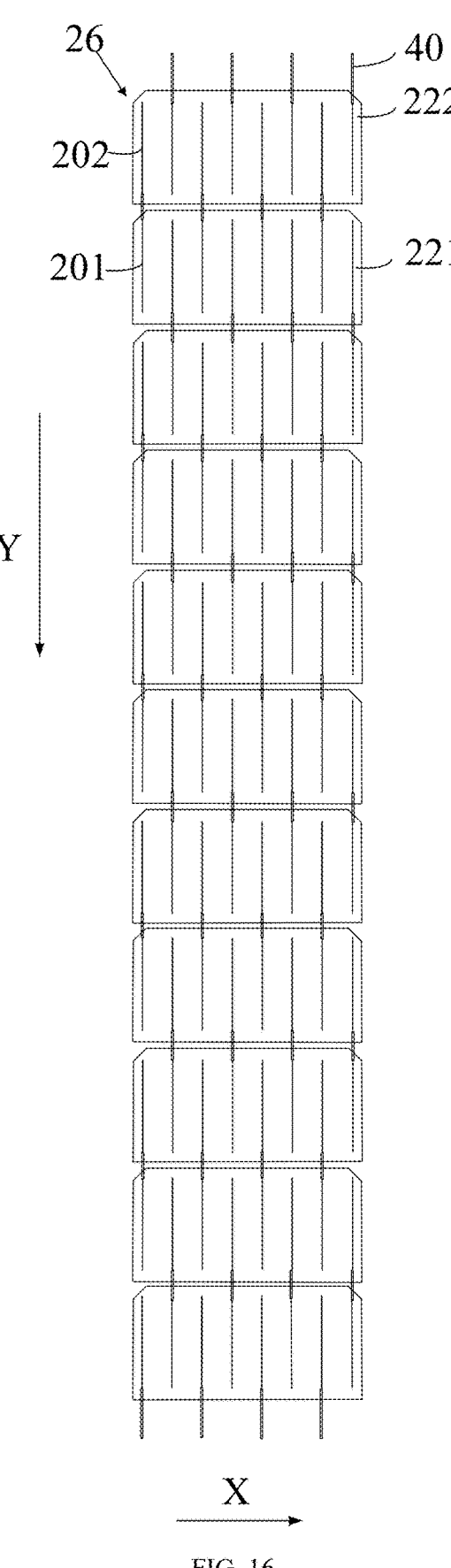
FIG. 16 is a schematic structural diagram of forming a sixth cell string in a method for manufacturing a photovoltaic module according to an embodiment of the disclosure.

FIG. 12 is a schematic structural diagram of forming a third cell string in a method for manufacturing a photovoltaic module according to an embodiment of the disclosure. FIG. 13 is a schematic structural diagram of forming a fourth cell string in a method for manufacturing a photovoltaic module according to an embodiment of the disclosure. FIG. 15 is a schematic structural diagram of forming a fifth cell string in a method for manufacturing a photovoltaic module according to an embodiment of the disclosure. FIG. 16 is a schematic structural diagram of forming a sixth cell string in a method for manufacturing a photovoltaic module according to an embodiment of the disclosure.

Referring to FIGS. 12, 13, 15, and 16, cell strings are formed. The cell strings include a third cell string 23, a fourth cell string 24, a fifth cell string 25, and a sixth cell string 26. The third cell string 23 or the fifth cell string 25 is formed by alternatively arranging, in the second direction Y, the first solar cells 221 and the second solar cells 222 rotated by 180°. The fourth cell string 24 or the sixth cell string 26 is formed by alternatively arranging, in the second direction Y, the second solar cells 222 rotated by 180° and the first solar cells 221.

In some embodiments, the third cell string 23 and the fifth cell string 25 are formed as follows.

At S1, the second connection structure 40 is electrically connected with the first grid line 201 of a first solar cell 221 by welding, bonding, or the like, and the second connection structure 40 extends in an extension direction of the grid line 210 and beyond an edge of a side of the first solar cell 221.

At S2, the second solar cell 222 is rotated by 180°, to ensure that a polarity of each grid line 210 of the second solar cell 222 along the extension direction of the grid line 210 is reversed to that of a corresponding grid line 210 of the first solar cell 221, and an extension line of each grid line 210 of the second solar cell 222 and an extension line of the corresponding grid line 210 of the first solar cell 221 are on a same vertical line (i.e., the second direction Y) or overlapped. That is, each second grid line 202 of the second solar cell 222 directly faces a corresponding first grid line 201 of the first solar cell 221. The second connection structure 40 connects the second main grid line of the first solar cell 221 and the first grid line 201 of the second solar cell 222, respectively.

At S3, another first solar cell 221 is placed after the second solar cell 222, and each of the second grid lines 202 of the second solar cell 222 that are not welded with second connection structures 40 is electrically connected with a corresponding first grid line of first grid lines 201 of the another first solar cell 221 through one second connection structure 40.

Operations at S2 and S3 are continued to be performed until the last solar cell of the cell string is welded, where second connection structures 40 are respectively welded with grid lines 210 of the last solar cell of the cell string, and the second connection structure 40 extends in an extension direction of the grid line 210 and beyond an edge of a side of the last solar cell.

Referring to FIG. 12, when the cell string includes an even number of solar cells, the last solar cell of the cell string is the second solar cell 222, and each of the second connection structures 40 located at one end of the cell string directly face a corresponding second connection structure 40 located at the other end of the cell string, or each of the second connection structures 40 connected to the first solar cell 221 of the cell string is on an extension line of the corresponding second connection structure 40 connected to the last solar cell of the cell string. The cell string formed is the third cell string 23.

Referring to FIG. 15, when the cell string includes an odd number of solar cells, the last solar cell of the cell string is the first solar cell 221. In the first direction X, a distance between each of the second connection structures 40 located at one end of the cell string and the corresponding second connection structure 40 located at the other end of the cell string is the distance L between the first grid line 201 and the second grid line 202 adjacent to the first grid line 201. That is, the distance between each of the second connection structures 40 connected to the first of the solar cells of the cell string and the extension line of the corresponding second connection structure 40 connected to the last solar cell of the cell string is the distance L between the first grid line 201 and the second grid line 202 (referring to FIG. 11). The cell string formed is the fifth cell string 25.

In some embodiments, the fourth cell string 24 and the sixth cell string 26 are formed as follows.

At S1, the second solar cell 222 is rotated by 180°, and each of second connection structures 40 is electrically connected with a corresponding first grid line 201 of the second solar cell 222 by welding, bonding, etc. The second connection structure 40 extends in an extension direction of the grid line 210 and beyond an edge of a side of the second solar cell 222.

At S2, a first solar cell 221 is placed on a side of the second solar cell 222 away from the second connection structure 40, to ensure that a polarity of each of grid lines 210 of the second solar cell 222 along the extension direction of the grid line 210 is reversed to that of a corresponding grid line 210 of the first solar cell 221, and an extension line of each grid line 210 of the second solar cell 222 and an extension line of the corresponding grid line 210 of the first solar cell 221 are on a same vertical line or overlapped. That is, each second grid line 202 of the second solar cell 222 directly faces the corresponding first grid line 201 of the first solar cell 221. The second connection structure 40 connects the first main grid line of the first solar cell 221 and the second grid line 202 of the second solar cell 222, respectively.

At S3, another second solar cell 222 is rotated by 180° and then placed after the first solar cell 221, and each of the second grid lines 202 of the first solar cell 221 that are not welded with the second connection structures 40 is electrically connected with a corresponding first grid lines 201 of the another second solar cell 222 through one second connection structure 40.

Operations at S2 and S3 are continued to be performed until the welding of the last solar cell of each cell string is completed, where the second connection structures 40 are respectively welded with grid lines 210 of the last solar cell of the cell string, and the second connection structure 40 extends in the extension direction of the grid line 210 and beyond an edge of a side of the last solar cell.

Referring to FIG. 13, when the cell string includes an even number of solar cells, the last solar cell of the cell string is the first solar cell 221, each of the second connection structures 40 located at one end of the cell string directly face a corresponding second connection structure 40 located at the other end of cell string, or each of the second connection structures 40 connected to the first solar cell of the cell string is on an extension line of the corresponding second connection structure 40 connected to the last solar cell of the cell string. The cell string formed is the fourth cell string 24.

Referring to FIG. 16, when the cell string includes an odd number of solar cells, the last solar cell of the cell string is the second solar cell. In the first direction X, a distance between each of the second connection structures 40 located at one end of the cell string and the corresponding second connection structure 40 located at the other end of the cell string is the distance L between the first grid line 201 and the second grid line 202. That is, the distance between each of the second connection structures 40 connected to the first of the solar cells of the cell string and the extension line of the corresponding second connection structure 40 connected to the last solar cell of the cell string is the distance L between the first grid line 201 and the second grid line 202 (referring to FIG. 11). The cell string formed is the sixth cell string 26.

It can be understood that the first solar cell 221 and the second solar cell 222 are symmetrical relative to the cutting line $A_1$-$A_2$ (referring to FIG. 10) of the initial cell 220. The first solar cell 221 and the second solar cell 222 illustrated are illustrative only, and the first of solar cells may be the first solar cell 221 or the second solar cell 222.

Figure 14:
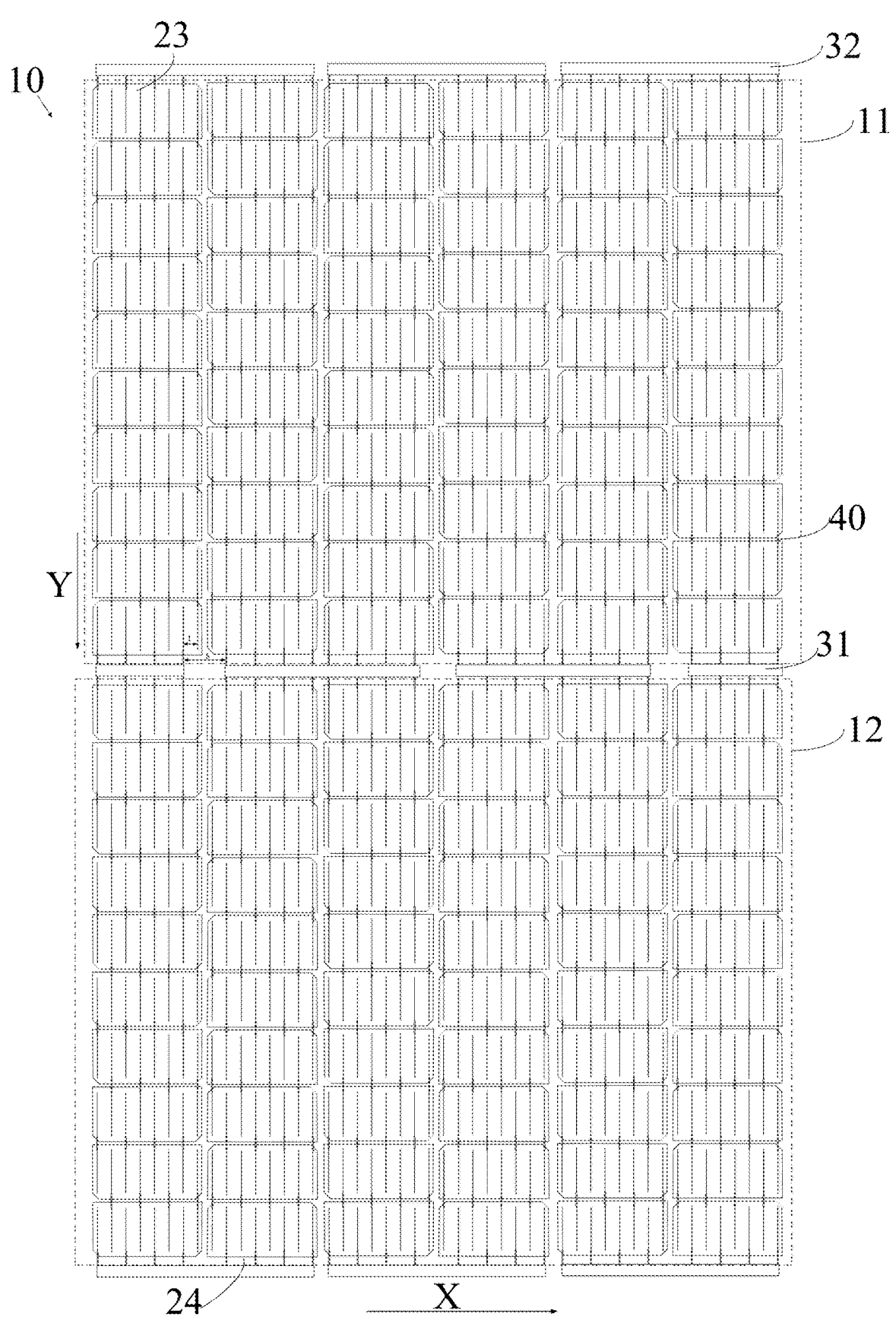
FIG. 14 is a schematic structural diagram of forming a cell string group in a method for manufacturing a photovoltaic module according to an embodiment of the disclosure.
Figure 17:
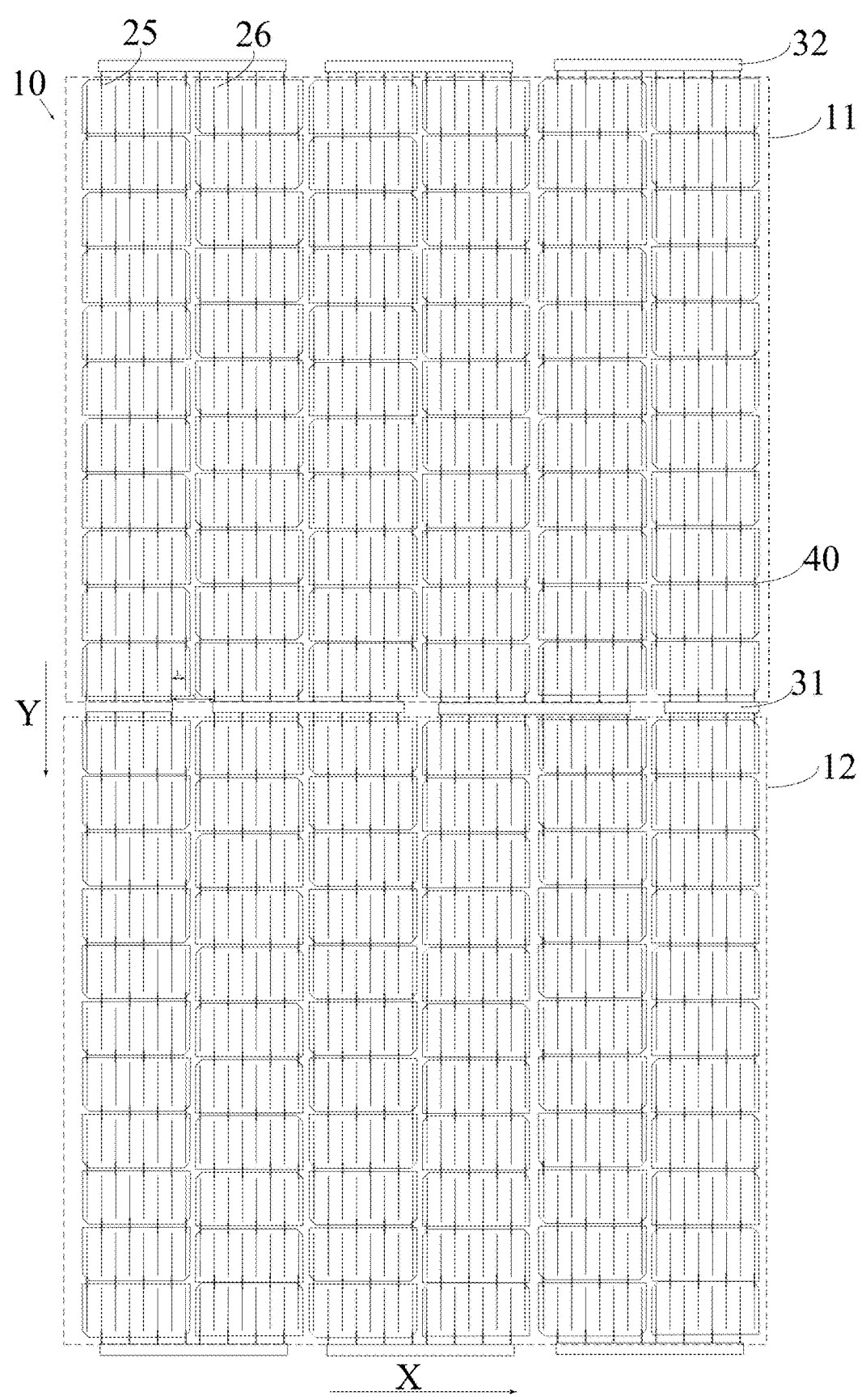
FIG. 17 is a schematic structural diagram of forming a cell string group in a method for manufacturing a photovoltaic module according to another embodiment of the disclosure.

FIG. 14 is a schematic structural diagram of forming a cell string group in a method for manufacturing a photovoltaic module according to an embodiment of the disclosure. FIG. 17 is a schematic structural diagram of forming cell string group in a method for manufacturing a photovoltaic module according to another embodiment of the disclosure.

Referring to FIGS. 14 and 17, multiple cell string groups are formed. Multiple cell strings are connected in a first electrical connection mode to form a cell string group, and the multiple cell strings 20 are alternatively arranged in the first direction X. The cell string group includes multiple first cell strings and multiple second cell strings, where the multiple first cell strings and the multiple second cell strings are alternatively arranged. A grid line 210 on an edge of each of the solar cells 200 of a respective first cell string 21 and a grid line 210 on an edge of a corresponding solar cell 200 of a second cell string 22 adjacent to the respective first cell string are adjacent to each other and have opposite conductivity types. The cell string groups includes at least one first cell string group 11 and at least one second cell string group 12. The first cell string group 11 and the second cell string group 12 are connected in a second electrical connection mode in the second direction Y. Specifically, the first electrical connection mode is series connection, and the second electrical connection mode is parallel connection.

In some embodiments, referring to FIG. 14, each cell string includes an even number of solar cells 200. The first cell string group 11 and the second cell string group 12 are formed as follows. In the first direction X, multiple third cell strings and multiple third cell strings rotated by 180° are alternatively arranged to form the first cell string group 11, and multiple fourth cell strings rotated by 180° and multiple fourth cell strings are alternatively arranged to form the second cell string group 12. In other embodiments, referring to FIG. 17, a cell string group is formed as follows. Multiple fifth cell strings and multiple sixth cell string rotated by 180° are alternatively arranged in the first direction X to form the cell string group.

Continuing to refer to FIGS. 14 and 17, a cell module is formed, where multiple cell string groups form the cell module.

In some embodiments, the method for manufacturing the photovoltaic module further includes the following. Multiple first connection structure and multiple second connection structures 40 are provided. The first connection structure extends in the first direction X, and each first connection structure is configured to connect cell strings. Each second connection structure 40 is configured to connect grid lines 210. The first connection structures include at least one middle first connection structure 31. Each middle first connection structure 31 connects at least one cell string of a corresponding first cell string group 11 and at least one cell string of a corresponding second cell string group 12. Each of at least one second connection structure 40 located at an end of a respective cell string is connected to a corresponding middle first connection structure 31. A second connection structure 40 connected to an end of a respective middle first connection structure 31 and another second connection structure 40 connected to an end of another middle first connection structure 31 adjacent to the respective middle first connection structure 31 are adjacent to each other and have a distance S along the first direction X therebetween, where the distance S is greater than the distance L between the first grid line 201 and the second grid line 202 adjacent to the first grid line 201 of the solar cell. Therefore, the spacing between adjacent lead lines connected with the middle first connection structures is relatively large, thereby avoiding short circuit. Moreover, since the spacing between the adjacent lead lines is relatively large, that is, there is no contact between the adjacent lead lines, so that the adjacent lead lines do not need to be insulated by isolation materials, which not only simplifies the process, improves the processing efficiency, but also reduces the use of raw materials and reduces the manufacturing cost. In other embodiments, the second connection structure 40 connected to the end of the respective middle first connection structure 31 and the another second connection structure 40 connected to the end of the another middle first connection structure 31 are adjacent to each other and have a distance S in the first direction X therebetween, where the distance S is greater than twice the distance L between the first grid line 201 and the second grid line 202 of the solar cell.

In some embodiments, the first connection structures further include at least one end first connection structure 32. The end first connection structure 32 is an end bus bar. each end first connection structure 32 is connected with the other end of a corresponding cell string away from a corresponding middle first connection structure 31. The end first connection structures 32 are respectively disposed on both ends of the cell module.

In some embodiments, referring to FIG. 17, each cell string includes an odd number of solar cells 200. In the first direction X, a second connection structure 40 connected to an end of a respective end first connection structure 32 is adjacent to another second connection structure 40 connected to an end of another end first connection structure 32 adjacent to the respective second connection structure 40, and a distance M between the second connection structure 40 connected to the end of the respective end first connection structure 32 and the another second connection structure 40 connected to the end of the another end first connection structure 32 adjacent to the respective second connection structure 40 is greater than twice the distance L between the first grid line 201 and the second grid line 202 of the solar cell 200. In other embodiments, referring to FIG. 12, the cell string includes an even number of solar cells 200. In the first direction X, the second connection structure 40 connected to the end of the respective end first connection structure 32 is adjacent to the another second connection structure 40 connected to the end of the another end first connection structure 32 adjacent to the respective end first connection structure 32, and the distance N between the second connection structure 40 connected to the end of the respective end first connection structure 32 and the another second connection structure 40 connected to the end of the another end first connection structure 32 adjacent to the respective end first connection structure 32 is less than twice the distance L between the first grid line 201 and the second grid line 202 of the solar cell 200.

In some embodiments, for each second connection structure 40 of the multiple second connection structures, in the second direction, the second connection structure 40 connects a first grid line 201 having a first conductivity type in a corresponding first solar cell 221 and a second grid line 202 having a second conductivity type in a second solar cell 222 adjacent to the corresponding first solar cell 221, where the first grid line 201 in the first solar cell 221 directly faces the second grid line 202 in the second solar cell 222. Alternatively, in the second direction, the second connection structure 40 connects the second grid line 202 having the second conductivity type in the corresponding first solar cell 221 and a first grid line 201 having the first conductivity type in the second solar cell 222 adjacent to the corresponding first solar cell, where the second grid line 202 in the corresponding first solar cell 221 directly faces the first grid line 201 in the second solar cell 222.

In some embodiments, after the cell module is formed, the following can be further conducted. Lead lines and a junction box are formed. The lead line is connected to the middle first connection structure 31, one of adjacent lead lines is connected to a positive output of a cell string and the other of the adjacent lead lines is connected to a negative output of another cell string 20 adjacent to the cell string. The junction box is provided with diodes, and both ends of the diode are connected in reverse parallel with the cell string through the lead lines, so as to avoid exceeding the cell reverse bias limit and further avoid damaging the photovoltaic module.

In some embodiments, the distance L between the first grid line 201 and the second grid line 202 of the solar cell ranges from 3.5 mm to 20 mm. Preferably, the distance L between the first grid line 201 and the second grid line 202 of the solar cell 200 ranges from 4 mm to 10 mm, such as, 4.3 mm, 5.6 mm, 6.3 mm, 8.2 mm, or 9.9 mm. The second connection structure 40 connected to the end of the middle first connection structure 31 is adjacent to the another second connection structure 40 connected to the end of the another adjacent middle first connection structure 31 and the distance S, in the first direction X, between the second connection structure 40 connected to the end of the middle first connection structure 31 and the another second connection structure 40 connected to the end of the another adjacent middle first connection structure 31 ranges from 8 mm to 50 mm. Preferably, the distance S, in the first direction X, between the second connection structure 40 and the another second connection structure 40 ranges from 10 mm to 25 mm, such as, 12 mm, 15 mm, 16.9 mm, 19 mm, or 23.9 mm. In one example, the distance L between the first grid line 201 and the second grid line 202 of the solar cell 200 is 4.3 mm, and the distance S, in the first direction X, between the second connection structure 40 and the another second connection structure 40 is 12 mm, such that the distance S is greater than twice the distance L between the first grid line 201 and the second grid line 202 of the solar cell 200. Therefore, the spacing between the adjacent lead lines connected to the middle first connection structures 31 is relatively large, and short circuit may be avoided. Moreover, since the distance between adjacent lead lines is relatively large, that is, there is no contact between the adjacent lead lines, and isolation materials are not needed for insulation, which not only simplifies the process, improves the processing efficiency, but also reduces the use of raw materials and reduces the manufacturing cost.

Those of ordinary skill in the art should appreciate that the embodiments described above are specific embodiments of the disclosure, and in practical application, various changes may be made thereto in form and detail without departing from the scope of the disclosure. Any one of those skilled in the art may make their own changes and modifications without departing from the scope of the present disclosure. Therefore, the protection scope of the disclosure shall be subject to the scope defined in the claims.

What is claimed is:

1. A photovoltaic module, comprising a cell module, wherein the cell module comprises:

a plurality of cell string groups, wherein each cell string group of the plurality of cell string groups includes a plurality of cell strings arranged along a first direction and electrically connected in a first electrical connection mode, wherein the plurality of cell string groups include at least one first cell string group and at least one second cell string group, and wherein a respective cell string group of the at least one first cell string group and a corresponding cell string group of the at least one second cell string group are arranged along a second direction and electrically connected in a second electrical connection mode; and a plurality of first connection structures extending in the first direction, wherein each of the plurality of first connection structures is configured to connect corresponding cell strings, and wherein the plurality of first connection structures include at least one middle first connection structure, and each middle first connection structure is configured to connect at least one cell string of a respective first cell string group and at least one cell string of a corresponding second cell string group;

wherein each of the plurality of cell strings comprises:

a plurality of solar cells electrically connected in the first electrical connection mode, wherein the plurality of solar cells are back contact solar cells; and a plurality of second connection structures, wherein each of the plurality of second connection structures is configured to connect corresponding soler cells, the plurality of second connection structures include interleaving third connection structures and fourth connection structures on a corresponding solar cell, and each third connection structure is spaced from an adjacent fourth connection structure by a first distance L in the first direction; wherein:

the plurality of second connection structures further include at least one second connection structure on a solar cell at an end of a respective cell string, each of the at least one second connection structure is connected with a corresponding first connection structure; and a second connection structure connected to an end of a respective middle first connection structure is spaced apart by a second distance S in the first direction from an adjacent second connection structure connected to an end of another middle first connection structure adjacent to the respective middle first connection structure, and the second distance S is greater than the first distance L;

wherein the plurality of first connection structures further comprise at least one end first connection structure, and another end of the respective cell string is connected with a corresponding end first connection structure; and wherein a second connection structure connected to an end of a respective end first connection structure is spaced apart by a third distance in the first direction from an adjacent second connection structure connected to an end of another end first connection structure adjacent to the respective end first connection structure, and the third distance is less than twice the first distance L in response to each of the plurality of cell strings including an even number of solar cells, or the third distance is greater than twice the first distance L in response to each of the plurality of cell strings including an odd number of solar cells.

2. The photovoltaic module of claim 1, wherein the even number of solar cells comprise a plurality of first solar cells and a plurality of second solar cells, a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell; and wherein each of the at least one first cell string group comprises a plurality of first cell strings and a plurality of first cell strings rotated by 180° that are alternately arranged in the first direction, and each of the plurality of first cell strings comprises the plurality of first solar cells and the plurality of second solar cells rotated by 180° that are alternately arranged in the second direction.

3. The photovoltaic module of claim 1, wherein the even number of solar cells comprise a plurality of first solar cells and a plurality of second solar cells, a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell; and wherein each of the at least one second cell string group comprises a plurality of first cell strings rotated by 180° and a plurality of first cell strings that are alternately arranged in the first direction, and each of the plurality of first cell strings comprises the plurality of second solar cells rotated by 180° and the plurality of first solar cells that are alternately arranged in the second direction.

4. The photovoltaic module of claim 1, wherein the odd number of solar cells comprise a plurality of first solar cells and a plurality of second solar cells, a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell;

wherein a respective cell string group of the plurality of cell string groups comprises a plurality of first cell strings and a plurality of second cell strings rotated by 180° that are alternately arranged in the first direction; and wherein each of the plurality of first cell strings comprises the plurality of first solar cells and the plurality of second solar cells rotated by 180° that are alternately arranged in the second direction, and each of plurality of second cell strings comprises the plurality of second solar cells rotated by 180° and the plurality of first solar cells that are alternately arranged in the second direction.

5. The photovoltaic module of claim 4, wherein each solar cell of the plurality of solar cells comprises a plurality of first grid lines of the first conductivity type interleaved with a plurality of second grid lines of the second conductivity type, and a respective first grid line is electrically connected with a corresponding third connection structure, and a respective second grid line is electrically connected with a corresponding fourth connection structure; and wherein in the second direction, each of the plurality of first grid lines having the first conductivity type in a respective first solar cell of the plurality of first solar cells and a corresponding second grid line having the second conductivity type in a second solar cell adjacent to the respective first solar cell are connected through a corresponding second connection structure;

wherein the each of the plurality of first grid lines having the first conductivity type directly faces the corresponding second grid line having the second conductivity type;

wherein each of the plurality of second grid lines having the second conductivity type in a respective first solar cell of the plurality of first solar cells and a corresponding first grid line having the first conductivity type in a second solar cell adjacent to the respective first solar cell are connected through a corresponding second connection structure; and wherein the each of the plurality of second grid lines having the second conductivity type directly faces the corresponding first grid line having the first conductivity type.

6. The photovoltaic module of claim 1, wherein each solar cell of the plurality of solar cells comprises a plurality of first grid lines of the first conductivity type interleaved with a plurality of second grid lines of the second conductivity type, and a respective first grid line is electrically connected with a corresponding third connection structure, and a respective second grid line is electrically connected with a corresponding fourth connection structure.

7. The photovoltaic module of claim 6, wherein in the second direction:

a respective first grid line of a solar cell of the plurality of solar cells of each of the at least one cell string of the corresponding first cell string group adjacent to the respective middle first connection structure is on an extension line of a corresponding first grid line of a solar cell of the plurality of solar cells of each of the at least one cell string of the corresponding second cell string group, adjacent to the respective middle first connection structure; and a respective second grid line of the solar cell of the plurality of solar cells of each of the at least one cell string of the corresponding first cell string group, adjacent to the respective middle first connection structure is on an extension line of a corresponding second grid line of the solar cell of the plurality of solar cells of each of the at least one cell string of the corresponding second cell string group, adjacent to the respective middle first connection structure.

8. The photovoltaic module of claim 6, wherein in the second direction:

a respective first grid line of a solar cell of the plurality of solar cells of each of the at least one cell string of the corresponding first cell string group adjacent to the respective middle first connection structure is spaced apart by a distance W in the first direction from an extension line of a corresponding first grid line of a solar cell of the plurality of solar cells of each of the at least one cell string of the corresponding second cell string group adjacent to the respective middle first connection structure, and the distance W is less than 0.5 times the first distance L.

9. The photovoltaic module of claim 6, wherein in the second direction:

a respective second grid line of a solar cell of the plurality of solar cells of each of the at least one cell string of the corresponding first cell string group adjacent to the respective middle first connection structure is spaced apart by a distance U in the first direction from an extension line of a corresponding second grid line of a solar cell of the plurality of solar cells of each of the at least one cell string of the corresponding second cell string group adjacent to the respective middle first connection structure, and the distance U is less than 0.5 times the first distance L.

10. The photovoltaic module of claim 6, wherein a respective solar cell of the plurality of solar cells is a slice cell and comprises an even number of grid lines.

11. The photovoltaic module of claim 1, wherein the second distance S is greater than twice the first distance L.

12. The photovoltaic module of claim 1, wherein the first distance L ranges from 3.5 mm to 20 mm.

13. The photovoltaic module of claim 1, wherein the second distance S is in the range of 8 mm to 50 mm.

14. The photovoltaic module of claim 6, wherein for the plurality of cell strings of each of the plurality of cell string groups, a grid line on an edge of each of the plurality of solar cells of a respective cell string of the plurality of cell strings and a grid line on an edge of a corresponding solar cell on another cell string adjacent to the respective cell string are spaced apart from each other and have opposite conductivity types.

15. The photovoltaic module of claim 6, wherein each of the plurality of first grid lines and the plurality of second grid lines has a width ranging from 40 um to 80 um, and each of the plurality of solar cells has a thickness in a range of 100 um to 300 um.

16. A method for manufacturing the photovoltaic module of claim 1, comprising:

forming the cell module, including:

forming the plurality of cell string groups; and connecting corresponding cell strings using the plurality of first connection structures extending in the first direction, including connecting at least one cell string of a respective first cell string group and at least one cell string of a corresponding second cell string group with a corresponding middle first connection structure;

wherein forming the plurality of cell string groups comprises, for the each cell string group of the plurality of cell string groups:

forming the plurality of cell strings, including forming the each of the plurality of cell strings by electrically connecting the plurality of solar cells in the first electrical connection mode; and connecting the each of the at least one second connection structure in the solar cell at the end of the respective cell string with the corresponding first connection structure such that the second distance S is greater than the first distance L.

17. The method of claim 16, wherein each of the plurality of cell strings comprises an even number of solar cells, and the even number of solar cells comprise a plurality of first solar cells and a plurality of second solar cells, wherein a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell, wherein forming a respective first cell string group of the at least one first cell string group comprises:

forming a plurality of first cell strings; wherein each of the plurality of first cell strings comprises the plurality of first solar cells and a plurality of second solar cells rotated by 180° that are alternately arranged in the second direction; and forming the respective first cell string group by alternately arranging, in the first direction, several first cell strings of the plurality of first cell strings and several first cell strings rotated by 180° of the plurality of first cell strings.

18. The method of claim 16, wherein each of the plurality of cell strings comprises an even number of solar cells, and the even number of solar cells comprise a plurality of first solar cells and a plurality of second solar cells, wherein a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell, wherein forming a respective second cell string group of the at least one second cell string group comprises:

forming a plurality of first cell strings, wherein each of the plurality of first cell strings comprises a plurality of second solar cells rotated by 180° and the plurality of first solar cells that are alternately arranged in the second direction; and forming the respective second cell string group by alternately arranging, in the first direction, several first cell strings of the plurality of first cell strings and several first cell strings rotated by 180° of the plurality of first cell strings.

19. The method of claim 16, wherein each of the plurality of cell strings comprises an odd number of solar cells, and the odd number of solar cells comprise a plurality of first solar cells and a plurality of second solar cells, wherein a respective first solar cell of the plurality of first solar cells and a respective second solar cell of the plurality of second solar cells are obtained by slicing a respective initial cell of a plurality of initial cells, and the respective first solar cell and the respective second solar cell are symmetrical relative to a cutting line of the respective initial cell, wherein forming a respective cell string group of the plurality of cell string groups comprises:

forming a plurality of first cell strings and a plurality of second cell strings, wherein each of the plurality of first cell strings comprises the plurality of first solar cells and a plurality of second solar cells rotated by 180° that are alternately arranged in the second direction, and each of plurality of second cell strings comprises the plurality of second solar cells rotated by 180° and the plurality of first solar cells that are alternately arranged in the second direction; and forming the cell string group by alternately arranging, in the first direction, the plurality of first cell strings and the plurality of second cell strings rotated by 180°.

20. The method of claim 19, wherein each solar cell of the plurality of solar cells comprises a plurality of first grid lines of the first conductivity type interleaved with a plurality of second grid lines of the second conductivity type, and a respective first grid line is electrically connected with a corresponding third connection structure, and a respective second grid line is electrically connected with a corresponding fourth connection structure, and wherein in the second direction, connecting each of the plurality of first grid lines having the first conductivity type in a respective first solar cell of the plurality of first solar cells and a corresponding second grid line having the second conductivity type in a second solar cell adjacent to the respective first solar cell through a corresponding second connection structure, wherein the each of the plurality of first grid lines having the first conductivity type directly faces the corresponding second grid line having the second conductivity type; and connecting each of the plurality of second grid lines having the second conductivity type in a respective first solar cell of the plurality of first solar cells and a corresponding first grid line having the first conductivity type in a second solar cell adjacent to the respective first solar cell through a corresponding second connection structure, wherein the each of the plurality of second grid lines having the second conductivity type directly faces the corresponding first grid line having the first conductivity type.

* * * * *